US010163915B1

(12) United States Patent
Zang et al.

(10) Patent No.: US 10,163,915 B1
(45) Date of Patent: Dec. 25, 2018

(54) VERTICAL SRAM STRUCTURE

(71) Applicant: GLOBALFOUNDRIES Inc., Grand Cayman (KY)

(72) Inventors: Hui Zang, Guilderland, NY (US); Jerome Ciavatti, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/634,227

(22) Filed: Jun. 27, 2017

(51) Int. Cl.
*H01L 27/11* (2006.01)
*H01L 29/78* (2006.01)
(Continued)

(52) U.S. Cl.
CPC .... *H01L 27/1104* (2013.01); *H01L 21/30604* (2013.01); *H01L 21/31111* (2013.01);
(Continued)

(58) Field of Classification Search
CPC ............. H01L 27/1104; H01L 29/0676; H01L 29/0847; H01L 29/1037; H01L 29/41741; H01L 29/7827
See application file for complete search history.

(56) References Cited

U.S. PATENT DOCUMENTS 9,419,003 B1 * 8/2016 Colinge .............. H01L 27/1104
9,640,636 B1 * 5/2017 Bentley ............. H01L 29/66666
(Continued)

OTHER PUBLICATIONS

U.S. Appl. No. 15/654,190, filed Jul. 19, 2017, titled Vertical SRAM Structure With Penetrating Cross-Coupled Contacts.

*Primary Examiner* — Allan R Wilson
(74) *Attorney, Agent, or Firm* — Heslin Rothenberg Farley & Mesiti P.C.; Stephen Scuderi

(57) ABSTRACT

A vertical SRAM cell includes a first ($1^{st}$) inverter having a $1^{st}$ pull-up (PU) transistor and a $1^{st}$ pull-down (PD) transistor. The $1^{st}$ PU and $1^{st}$ PD transistors have a bottom source/drain (S/D) region disposed on a substrate and a channel extending upwards from a top surface of the bottom S/D region. A second ($2^{nd}$) inverter has a $2^{nd}$ PU transistor and a $2^{nd}$ PD transistor. The $2^{nd}$ PU and $2^{nd}$ PD transistors have a bottom S/D region disposed on the substrate and a channel extending upwards from a top surface of the bottom S/D region. A $1^{st}$ metal contact is disposed on sidewalls, and not on the top surface, of the bottom S/D regions of the $1^{st}$ PU and $1^{st}$ PD transistors. A $2^{nd}$ metal contact is disposed on sidewalls, and not on the top surface, of the bottom S/D regions of the $2^{nd}$ PU and $2^{nd}$ PD transistors.

15 Claims, 27 Drawing Sheets

(51) Int. Cl.
  *H01L 29/08*   (2006.01)
  *H01L 29/10*   (2006.01)
  *H01L 29/417*  (2006.01)
  *H01L 29/06*   (2006.01)
  *H01L 21/8234* (2006.01)
  *H01L 21/3213* (2006.01)
  *H01L 21/306*  (2006.01)
  *H01L 21/311*  (2006.01)
  *H01L 21/768*  (2006.01)

(52) U.S. Cl.
  CPC .... *H01L 21/32133* (2013.01); *H01L 21/7684* (2013.01); *H01L 21/76802* (2013.01); *H01L 21/76877* (2013.01); *H01L 21/76897* (2013.01); *H01L 21/823437* (2013.01); *H01L 21/823481* (2013.01); *H01L 21/823487* (2013.01); *H01L 29/0676* (2013.01); *H01L 29/0847* (2013.01); *H01L 29/1037* (2013.01); *H01L 29/41741* (2013.01); *H01L 29/7827* (2013.01)

(56) References Cited

U.S. PATENT DOCUMENTS

| | | | |
|---|---|---|---|
| 2004/0043550 A1* | 3/2004 | Chakihara | H01L 21/823885 438/199 |
| 2016/0078922 A1* | 3/2016 | Liaw | H01L 29/66666 365/51 |
| 2016/0284712 A1* | 9/2016 | Liaw | H01L 27/1104 |
| 2017/0256548 A1* | 9/2017 | Hsu | H01L 27/1104 |

* cited by examiner

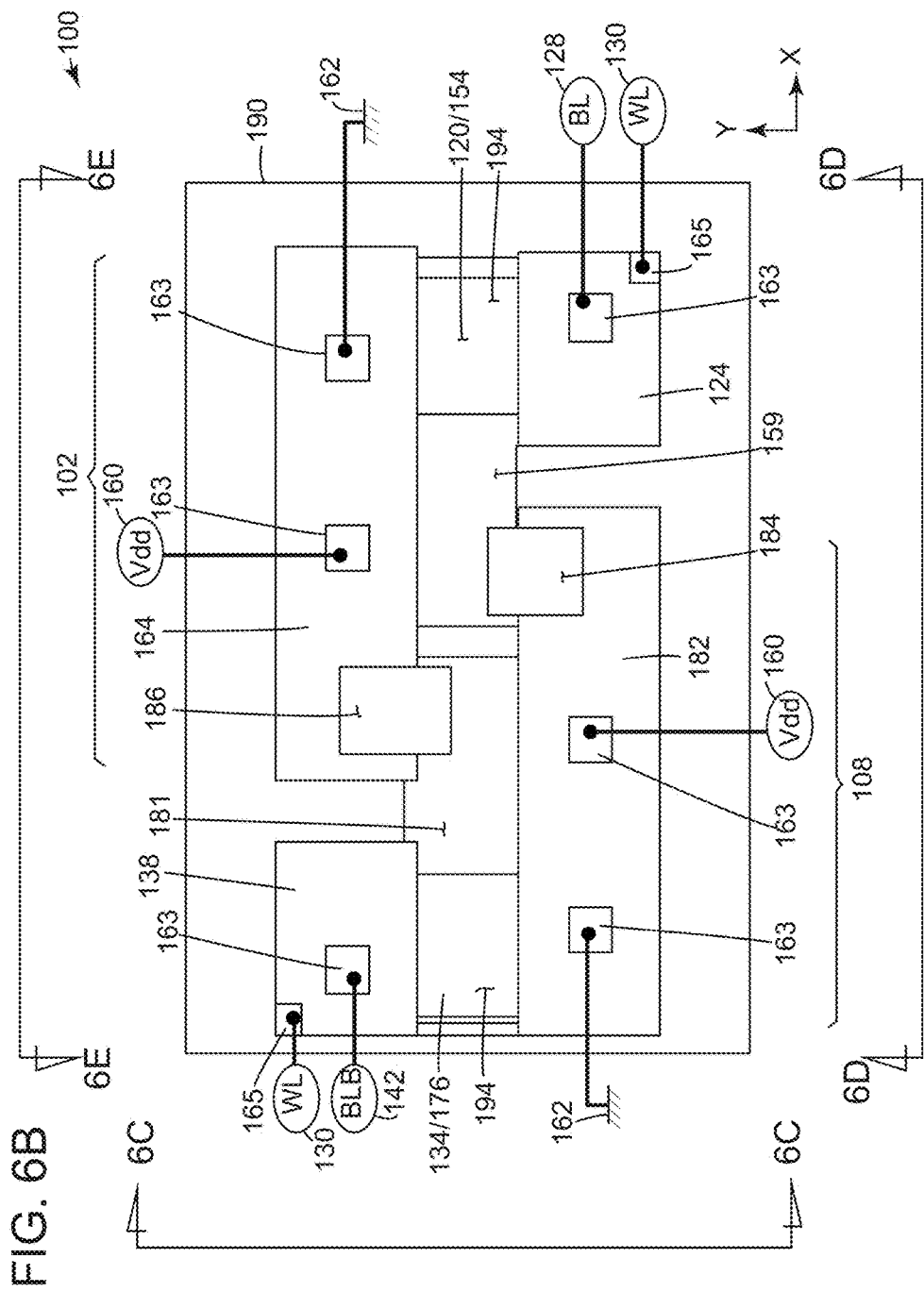

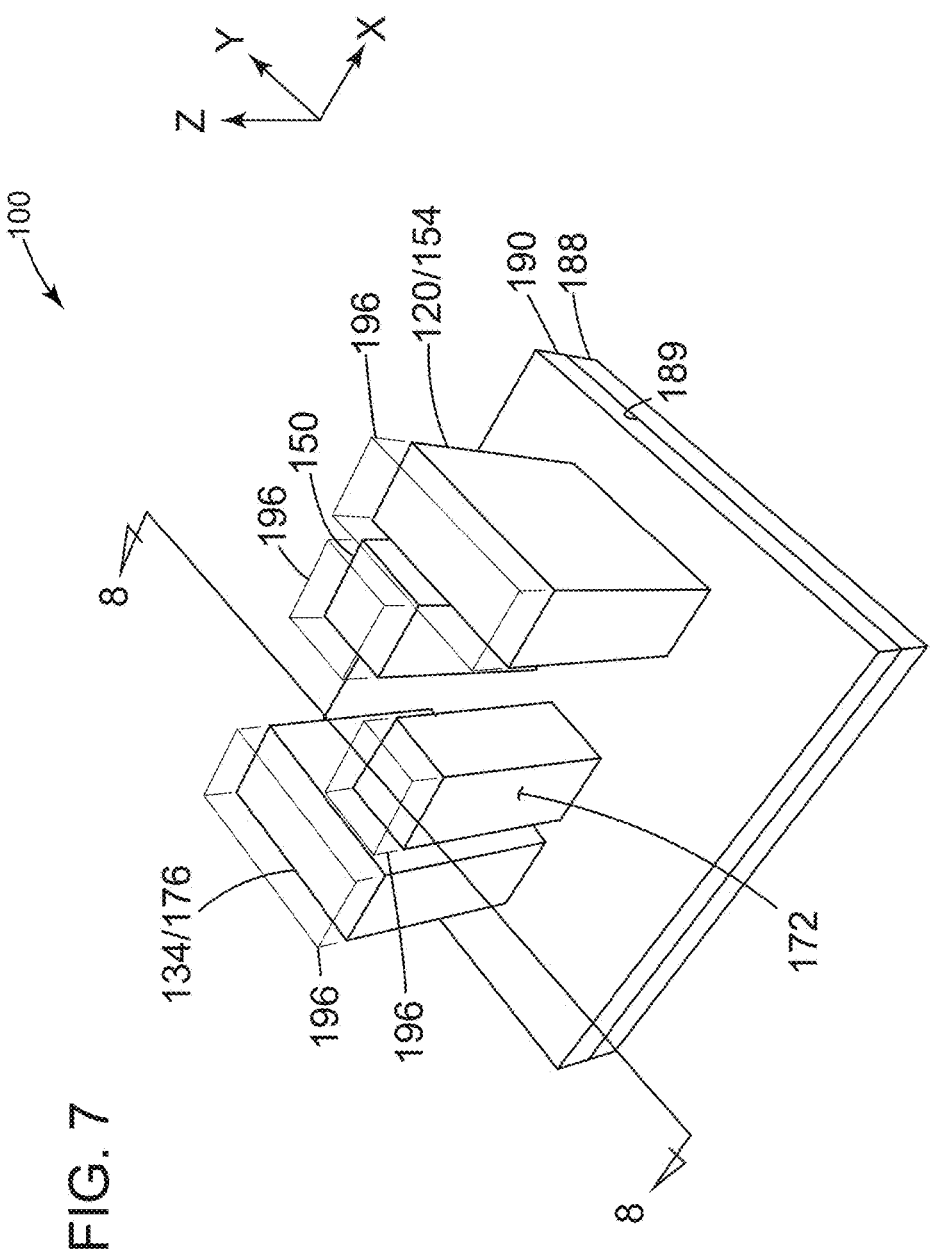

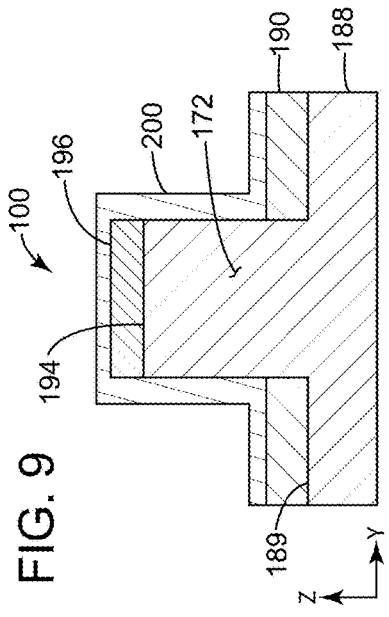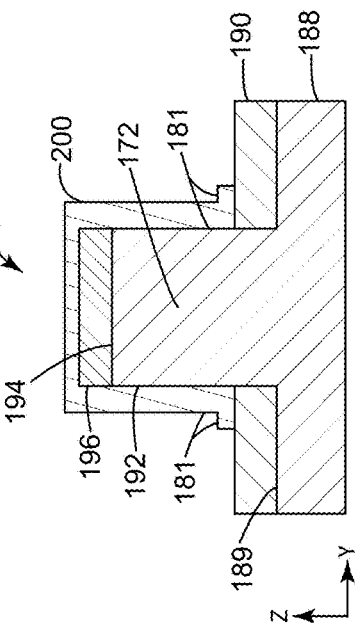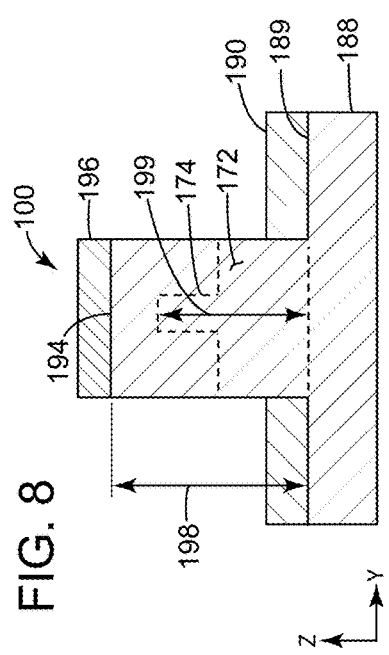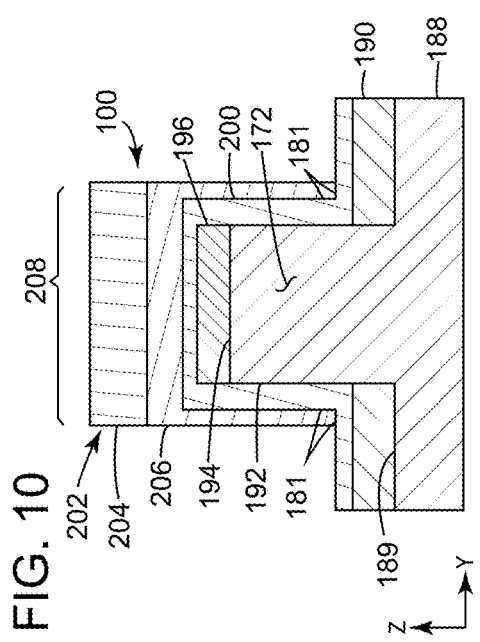

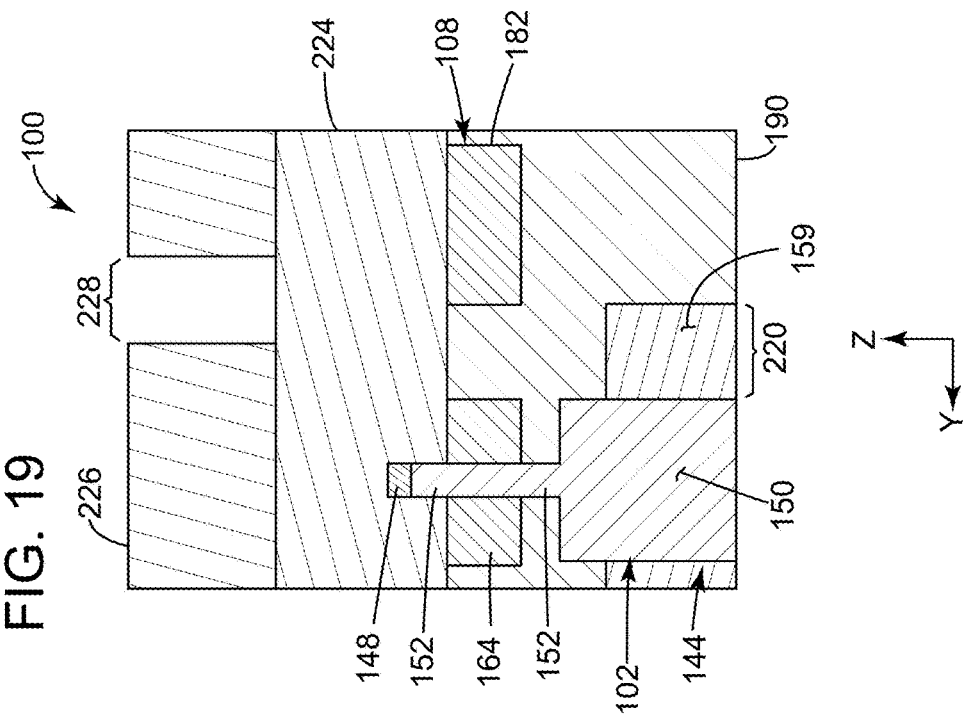
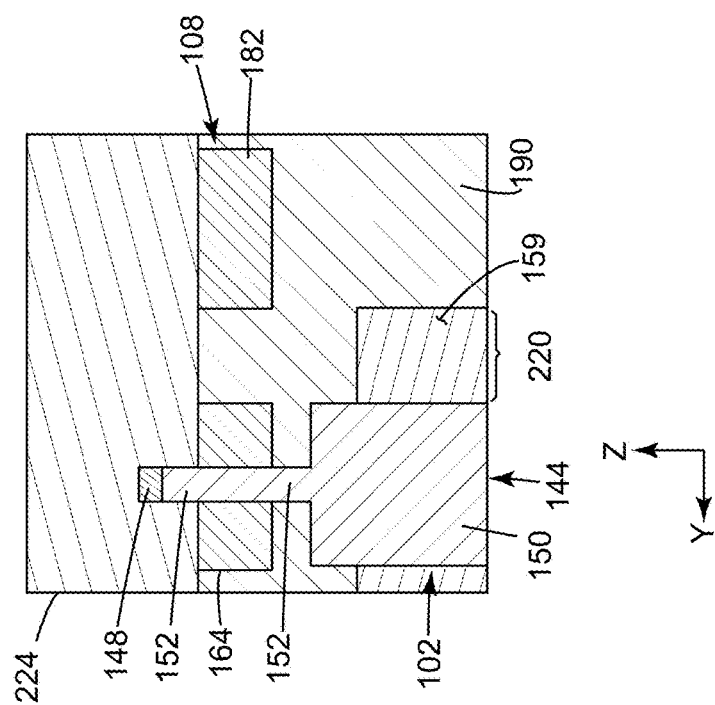

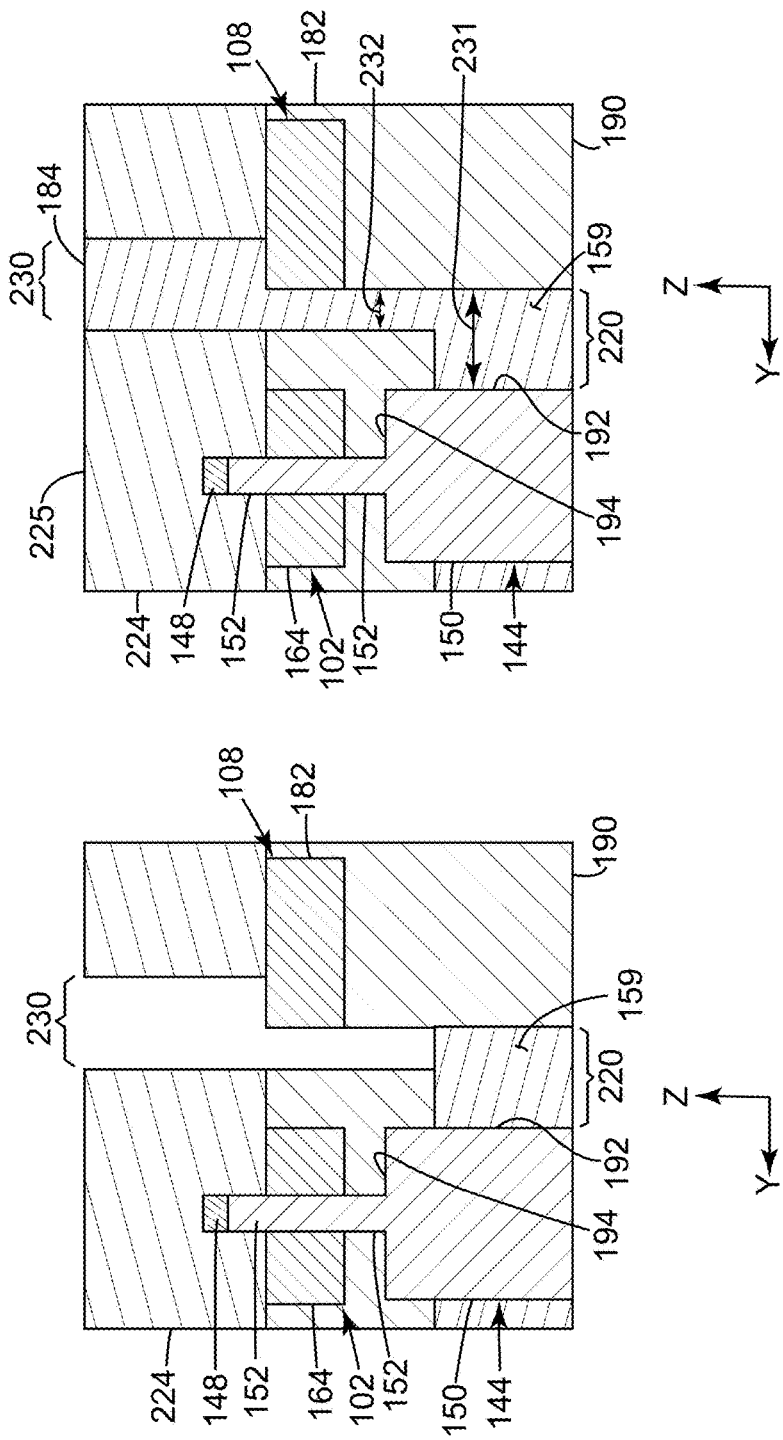

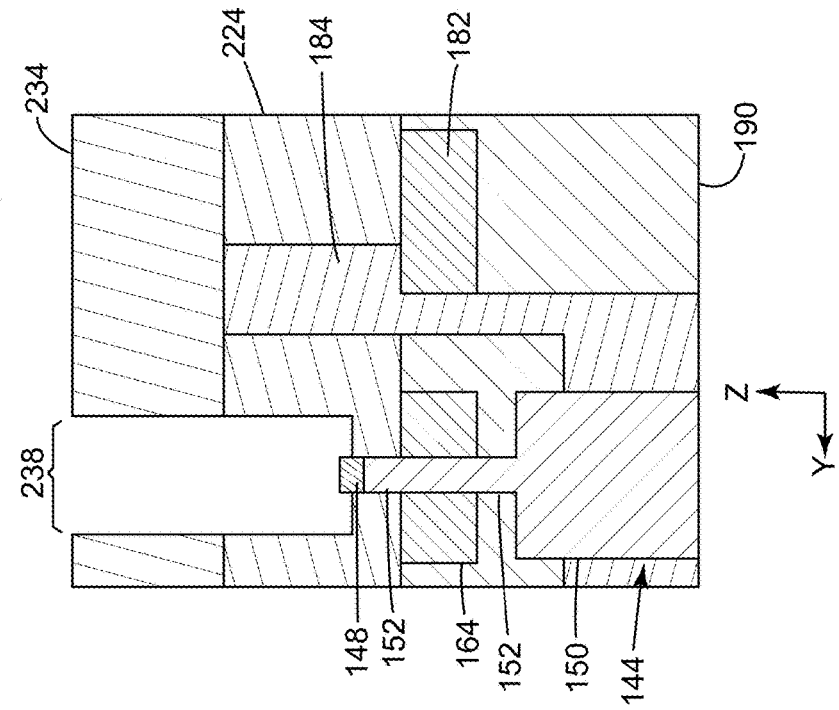
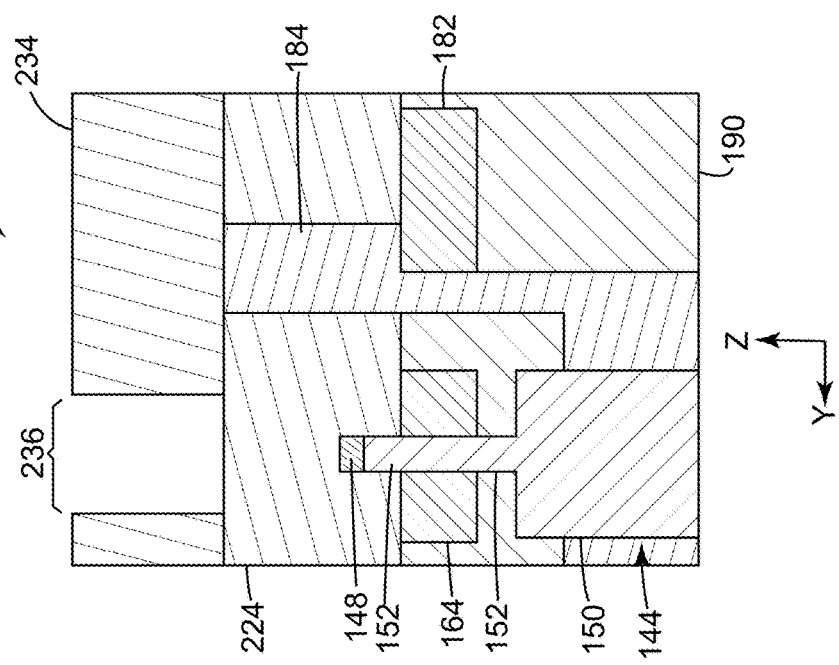

VERTICAL SRAM STRUCTURE

TECHNICAL FIELD

The present invention relates to semiconductor devices and methods of making the same. More specifically, the invention relates to vertical Static Random Access Memory (SRAM) cell structures and methods of making the same.

BACKGROUND

SRAM cells (or SRAM cell structures) in general are random access memory cells that retain data bits in their memory as long as power is being supplied. SRAM is used in personal computers, workstations, routers, peripheral equipment and the like.

SRAM cells are composed of a pair of cross coupled inverters connected together to form dual (first and second) storage node outputs with opposing logic states. Therefore SRAM cells have two stable logic states. The first logic state includes a logic one (1) and a logic zero (0) at the first and second storage node outputs, respectively. The second state includes a logic 0 and a logic 1 at the same first and second storage node outputs, respectively.

The storage nodes will be connected to a pair of pass gate transistors, which are typically n-type transistors. Typically each inverter includes a p-type pull up transistor and an n-type pull down transistor. One of the pass gate transistors is connected to a bit line and the other to a bit line bar (herein collectively "the bit lines"). A word line enables the pass gate transistors to control data flow between the inverters and the bit lines during read and write operations.

Generally in a semiconductor SRAM cell, the four n-type transistors (i.e., the two pass gate and two pull down transistors) are Fin Field Effect Transistors (FinFETs) imbedded in n-type fins that extend horizontally across a substrate of a semiconductor structure. Additionally, the two p-type transistors (the two pull up transistors) of the SRAM cell are FinFETs imbedded in p-type fins that extend horizontally across the same substrate. These types of prior art SRAM cells may be referred to herein as horizontal FinFET SRAM cells, since the source/drain regions and channels of the FinFETs are all disposed horizontally relative to a substrate plane that is defined by a top surface of the substrate.

SRAM cells are constantly being down-sized to meet increasingly demanding requirements to the speed and functionality of ultra-high density integrated circuits in semiconductor structures. As such, the FinFETs of the SRAM cells need to be ever more densely packaged within the substrate plane.

However, such down-sizing provides technical challenges that become increasingly problematic, especially for horizontal SRAM cells. For example, leakage currents of FinFETs may increase as the channels within the FinFETs become smaller in length. Moreover, it becomes ever more difficult to increase the overall area (or footprint) along the substrate plane of a semiconductor structure to accommodate larger numbers of horizontal SRAM cells as complexity of the semiconductor structure increases.

Some prior art SRAM cells may alleviate some of these technical challenges by using vertical FinFETs. These prior art vertical FinFETs have fins for channels that extend vertically upwards from a bottom source/drain (S/D) region embedded in the substrate to an upper S/D region disposed above the substrate.

However, landing metal contacts on the bottom S/D regions of vertical FinFETs becomes increasingly difficult as the vertical SRAM cells are downsized. This is because the metal contacts must be placed between the upper structures, such as the gate structure, of the vertical FinFETs without making undesirable electrical contact to those upper structures. Additionally, the metal contacts of prior art vertical FinFETs generally land on the upper surface of the bottom source drain regions, which provide an ever decreasing surface area as the SRAM cells are downsized.

Moreover, the metal contacts of prior art vertical FinFETs can get unacceptably close to the vertical channels when connecting to the bottom S/D regions. If the metal contacts touch the vertical channels, the metal contacts can contaminate the channel and adversely affect performance.

Additionally, vertical SRAM cells require a cross-coupled contact between certain bottom S/D regions of one inverter and certain gate regions of the other inverter of the SRAM cells. Such cross-coupled contacts are subject to similar types of technical problems as that of the placing of the metal contacts within a vertical SRAM cell. That is, the cross-coupled contacts must be made without undesirably shorting to other structures within the SRAM cells. Also the top surface of the bottom S/D regions provide an ever decreasing target for the cross-coupled contacts to land on as the SRAM cells are downsized. Additionally, the cross-coupled contacts must not touch and contaminate the channels.

Accordingly, there is a need for a vertical SRAM cell, and method of making the same, that more reliably enables proper electrical continuity of metal contacts to the bottom S/D regions than that of prior art vertical SRAM cells. Additionally, there is a need to prevent the metal contacts and cross-couple contacts from touching and contaminating the channels.

BRIEF DESCRIPTION

The present invention offers advantages and alternatives over the prior art by providing a vertical SRAM cell structure, and method of making the same, having metal contacts disposed on sidewalls, and not on the top surfaces, of the bottom S/D regions. Additionally, the cross-coupled contacts only land on the metal contacts and do not land on the bottom S/D regions. As such, the likelihood of the metal contacts or the cross-coupled contacts contacting and contaminating the channels is greatly reduced relative to prior art SRAM cell structures.

A vertical SRAM cell in accordance with one or more aspects of the present invention includes a first ($1^{st}$) inverter having a $1^{st}$ pull-up (PU) transistor and a $1^{st}$ pull-down (PD) transistor. The $1^{st}$ PU and $1^{st}$ PD transistors each have a bottom source/drain (S/D) region disposed on a substrate and a channel extending upwards from a top surface of the bottom S/D region. The vertical SRAM cell also includes a second ($2^{nd}$) inverter having a $2^{nd}$ PU transistor and a $2^{nd}$ PD transistor. The $2^{nd}$ PU and $2^{nd}$ PD transistors each have a bottom S/D region disposed on the substrate and a channel extending upwards from a top surface of the bottom S/D region. A $1^{st}$ metal contact is disposed on sidewalls, and not on the top surface, of the bottom S/D regions of the $1^{st}$ PU and $1^{st}$ PD transistors. A $2^{nd}$ metal contact is disposed on sidewalls, and not on the top surface, of the bottom S/D regions of the $2^{nd}$ PU and $2^{nd}$ PD transistors.

A method in accordance with one or more aspects of the present invention includes providing a vertical SRAM cell structure having a hardmask layer disposed over a substrate.

The structure is patterned to form bottom S/D regions for a 1$^{st}$ PU, a 1$^{st}$ PD and a 1$^{st}$ PG transistor of a 1$^{st}$ inverter and for a 2$^{nd}$ PU, a 2$^{nd}$ PD and a 2$^{nd}$ PG transistor of a 2$^{nd}$ inverter. The bottom S/D regions each having a top surface and sidewalls. An FOX layer is disposed over the structure. A metal contact layer is disposed over the structure. The metal contact layer is etched to form a 1$^{st}$ metal contact disposed on sidewalls, and not on the top surfaces, of the bottom S/D regions of the 1$^{st}$ PU and 1$^{st}$ PD transistors and to form a 2$^{nd}$ metal contact disposed on sidewalls, and not on the top surfaces, of the bottom S/D regions of the 2$^{nd}$ PU and 2 PD transistors. The bottom S/D regions are etched to recess the top surfaces and to form channels extending upwards from the top surface of each bottom S/D region.

DRAWINGS

The invention will be more fully understood from the following detailed description taken in conjunction with the accompanying drawings, in which:

FIG. 6B is a top view of the SRAM cell structure of FIG. 6A in accordance with the present invention;

FIG. 7 is an exemplary embodiment of the vertical SRAM cell structure of FIG. 6A at an intermediate stage of manufacture having bottom S/D regions etched into a substrate in accordance with the present invention;

FIG. 8 is a cross-sectional view of the vertical SRAM cell structure of FIG. 7 taken along the line 8-8 of FIG. 8 in accordance with the present invention;

FIG. 9 is an exemplary embodiment of the vertical SRAM cell structure of FIG. 8 having a metal contact layer disposed thereon in accordance with the present invention;

FIG. 10 is an exemplary embodiment of the vertical SRAM cell structure of FIG. 9 having a lithographic (litho) stack disposed thereon in accordance with the present invention;

FIG. 11 is an exemplary embodiment of the vertical SRAM cell structure of FIG. 10 having exposed portions of the metal contact layer etched away from an FOX layer in accordance with the present invention;

FIG. 18 is a cross-sectional view of the vertical SRAM cell structure of FIG. 17B taken along the line 18-18 of FIG. 17B in accordance with the present invention;

FIG. 19 is a cross-sectional view of an exemplary embodiment of the vertical SRAM cell structure of FIG. 18 having a litho stack disposed thereon and a cross-coupled opening disposed in the litho stack in accordance with the present invention;

FIG. 20 is a cross-sectional view of an exemplary embodiment of the vertical SRAM cell structure of FIG. 19 having a cross-coupled trench disposed therein in accordance with the present invention;

FIG. 21 is a cross-sectional view of an exemplary embodiment of the vertical SRAM cell structure of FIG. 20 having a cross-coupled contact disposed in the cross-coupled trench in accordance with the present invention;

FIG. 22 is a cross-sectional view of an exemplary embodiment of the vertical SRAM cell structure of FIG. 21 having a litho stack disposed thereon and an upper S/D region opening disposed in the litho stack in accordance with the present invention;

FIG. 23 is a cross-sectional view of an exemplary embodiment of the vertical SRAM cell structure of FIG. 22 having an upper S/D region trench therein in accordance with the present invention;

Figure 32:
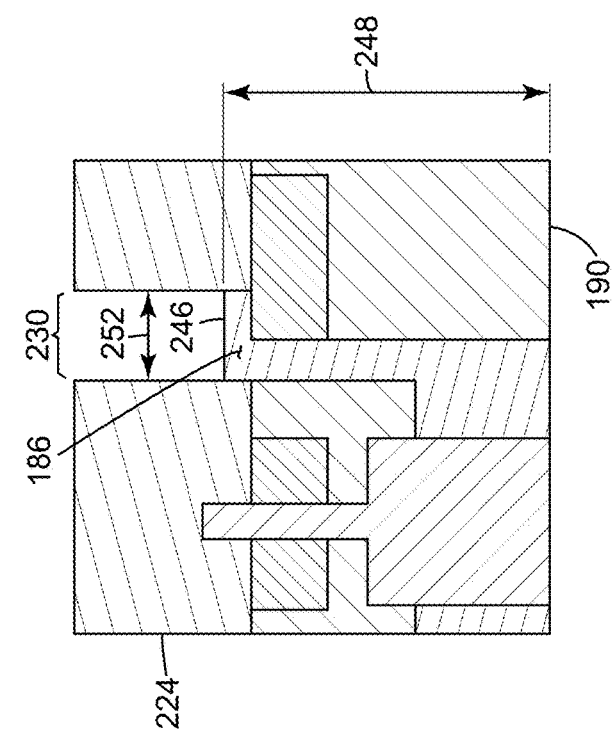
FIG. 32 is a cross-sectional view of the exemplary embodiment of the vertical SRAM cell structure of FIG. 31 having the cross-coupled trench etched to a $2^{nd}$ width in accordance with the present invention.
Figure 33:
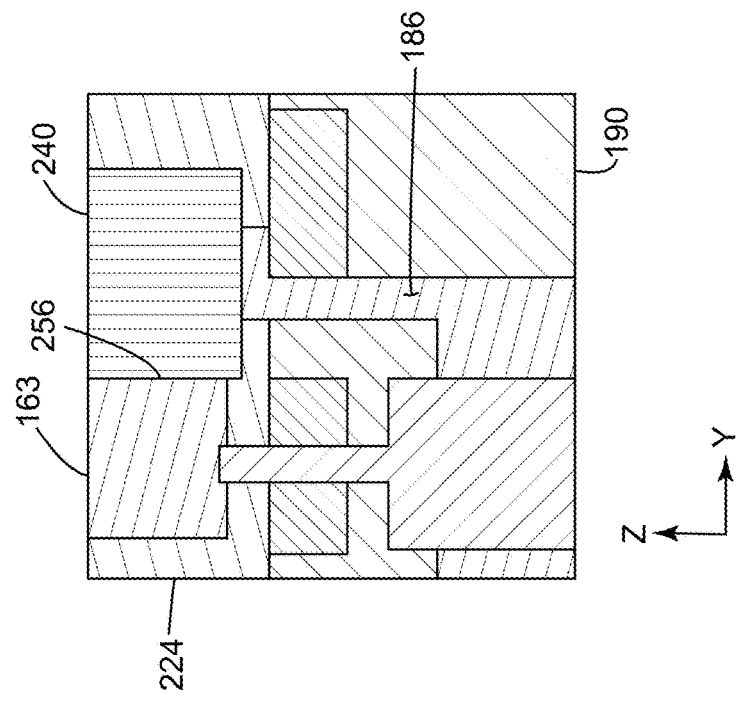
Figure 34:
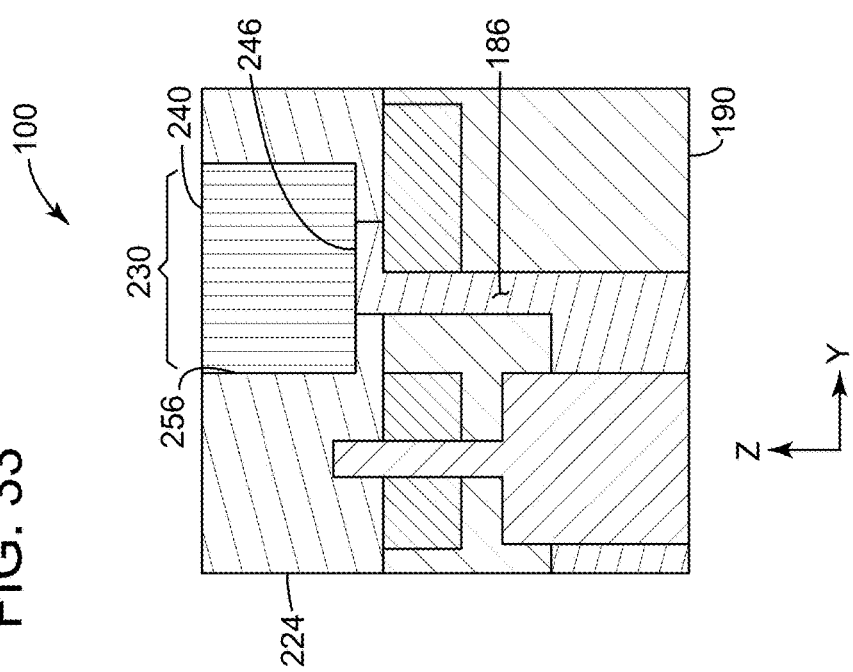

FIG. 33 is a cross-sectional view of the exemplary embodiment of the vertical SRAM cell structure of FIG. 32 having a dielectric plug disposed in the cross-coupled trench in accordance with the present invention; and FIG. 34 is a cross-sectional view of the exemplary embodiment of the vertical SRAM cell structure of FIG. 33 having a CA contact self-aligned with a sidewall of the dielectric plug in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
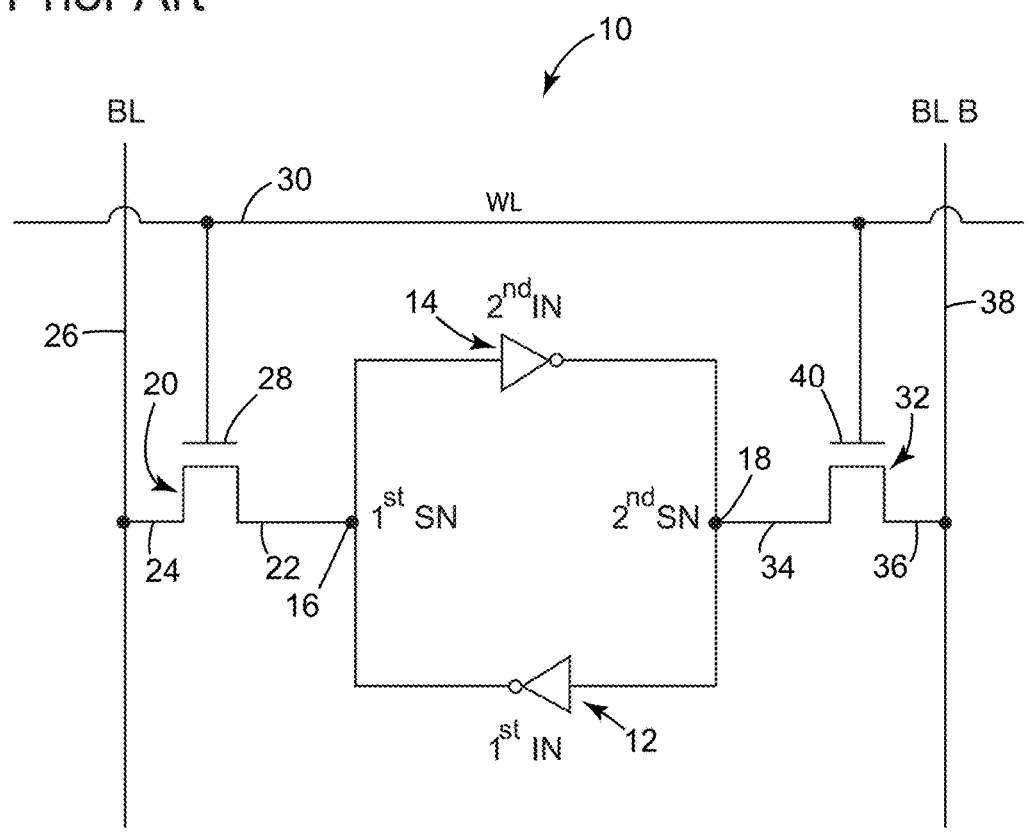
FIG. 1 is a schematic of a prior art horizontal SRAM cell structure showing a 1st and 2nd pass gate transistors and a pair of cross coupled 1$^{st}$ and 2$^{nd}$ inverters.
Figure 2:
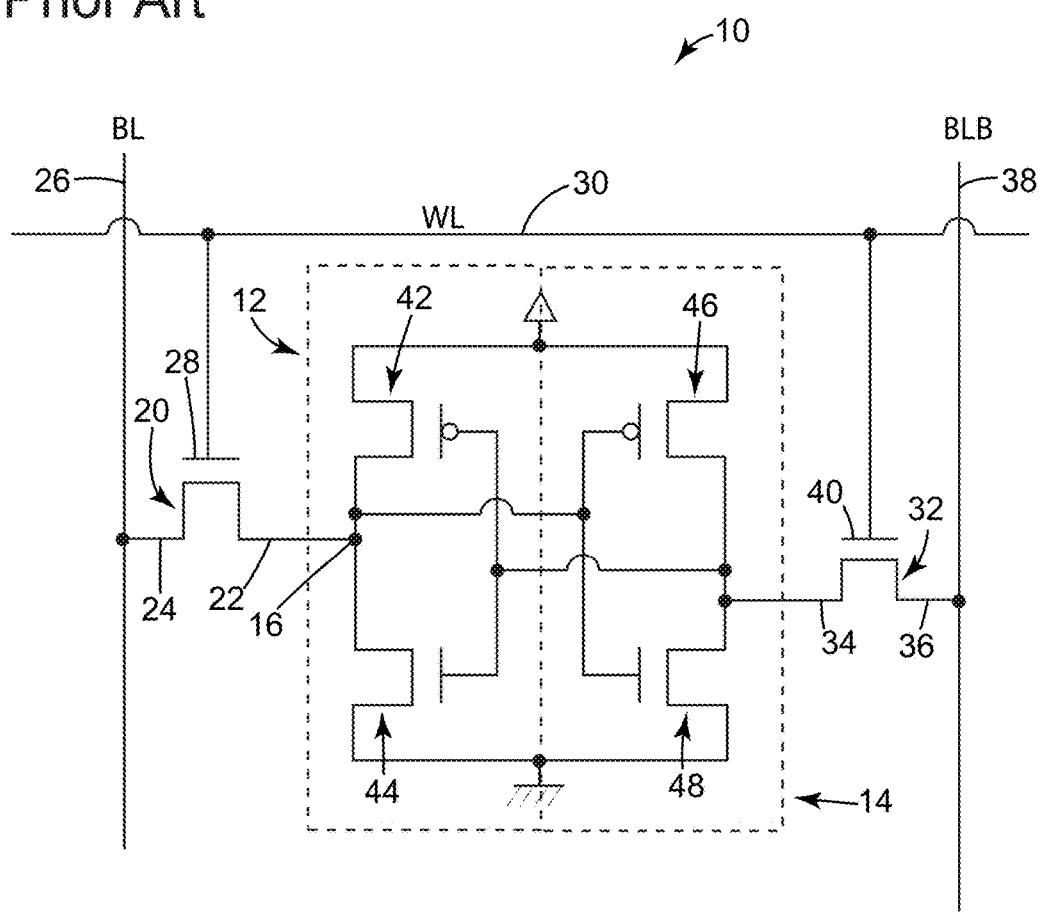
FIG. 2 is a schematic of the prior art horizontal SRAM cell structure of FIG. 1 showing the 1$^{st}$ inverter as having a 1$^{st}$ PU and a 1$^{st}$ PD transistor and the 2$^{nd}$ inverter as having a 2$^{nd}$ PU and a 2$^{nd}$ PD transistor.
Figure 3:
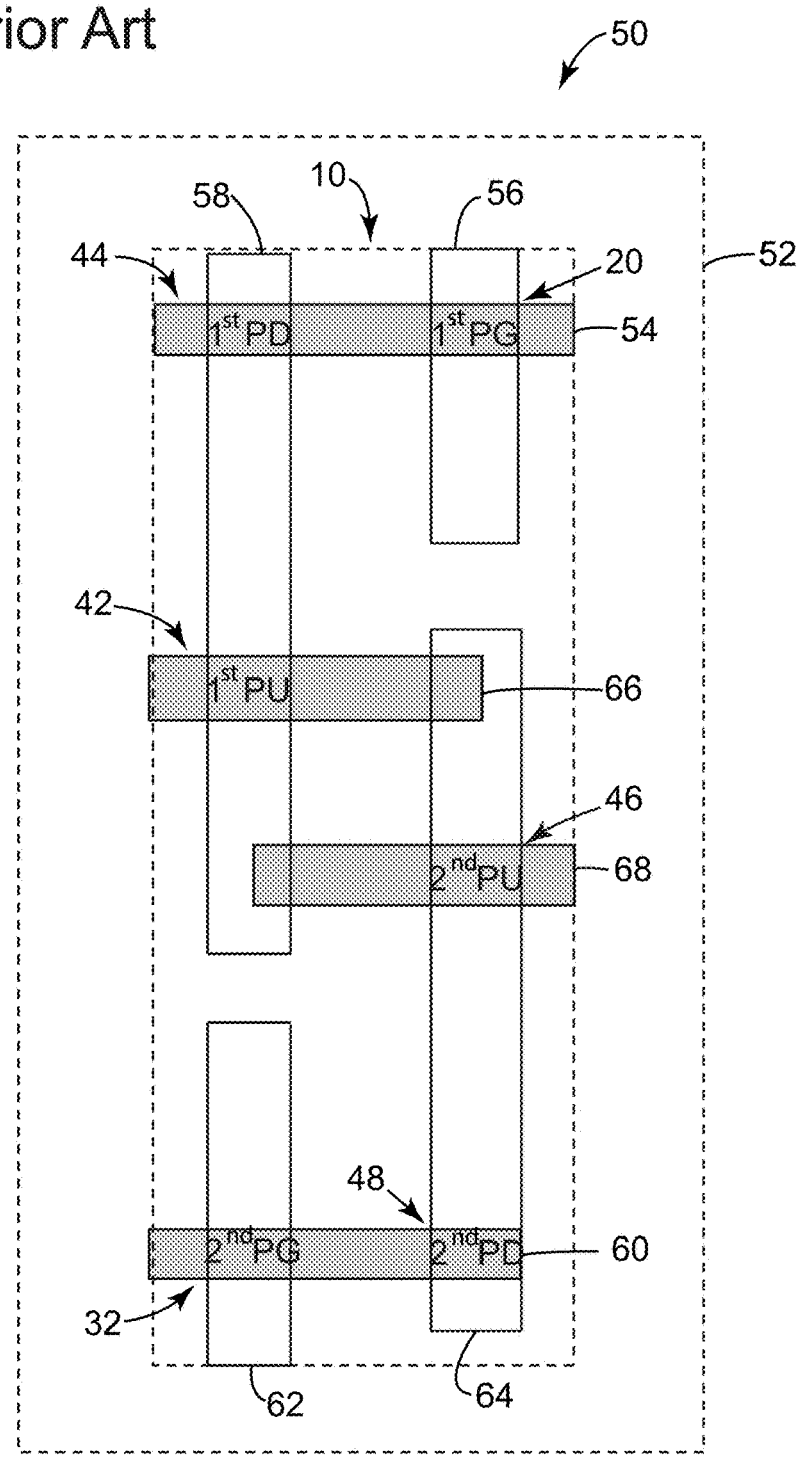
FIG. 3 is a top view of a layout of the prior art horizontal SRAM cell of FIG. 2 on a semiconductor structure having a substrate layer.

FIGS. 1-3 illustrate an exemplary embodiment of a prior art horizontal static random access memory (SRAM) cell structure 10. FIGS. 4-6E illustrate various exemplary embodiments of the structure of a vertical SRAM cell 100, in accordance with the present invention. FIGS. 7-34 illustrate various methods of making the vertical SRAM cell 100, in accordance with the present invention.

Referring to FIG. 1, a schematic of an exemplary embodiment of a prior art horizontal SRAM cell 10 is shown. In its most basic form, prior art SRAM cell 10 includes a first inverter (1st IN) 12 that is electrically cross-coupled to a second inverter (2nd IN) 14 to form a first storage node (1st SN) 16 and a second storage node (2nd SN) 18.

A first, typically n-type, pass gate transistor (1st PG) 20 is electrically connected to the 1st SN 16 through its drain region (1st PG-D) 22. The source region (1st PG-S) 24 of the first pass gate transistor 20 is connected to a bit line (BL) 26. The gate structure (1st PG-G) 28 of the 1st PG is connected to a word line (WL) 30.

A second, typically n-type, pass gate transistor (2nd PG) 32 is electrically connected to the 2nd SN 18 through its drain region (2nd PG-D) 34. The source region (2nd PG-S) 36 of the second pass gate transistor 32 is connected to a bit line bar (BLB) 38 (collectively, the BL 26 and BLB 38 being referred to herein as the "bit lines"). The gate structure (2nd PG-G) 40 of the 2nd PG 32 is connected to the WL 30.

The cross-coupled inverters 12, 14 provide an output at the 1st SN 16 and 2nd SN 18 that are always the logic inverse of each other. Therefore the prior art SRAM 10 has only two stable logic states wherein either:

a. $1^{st}$ SN 16 has a logic high signal and $2^{nd}$ SN 18 has a logic low signal; or b. $1^{st}$ SN 16 has a logic low signal and $2^{nd}$ SN 18 has a logic high signal. When the word line 30 is high, the pass gates 20, 32 are enabled and data will be transmitted between the storage nodes 16, 18 and the bit lines 26, 38 during a read or write operation.

Referring to FIG. 2, the 1st IN 12 commonly includes a first, typically p-type, pull-up transistor (1st PU) 42 and a first, typically n-type, pull-down transistor (1st PD) 44, which are wired as shown in FIG. 2. Additionally the 2nd IN 14 commonly includes a second, typically p-type, pull-up transistor (2nd PU) 46 and a second, typically n-type, pull-down transistor (2nd PD) 48, which are also wired as shown in FIG. 2.

Accordingly, this SRAM cell 10 is known as a six transistor SRAM cell 10, which is a common configuration of the SRAM cell. However, it is well-known that other transistor numbers and configurations may be included in the design of the inverters 12 and 14.

Referring to FIG. 3, an exemplary embodiment of a layout of the prior art horizontal SRAM cell 10 is illustrated on a semiconductor structure 50 having a substrate layer 52. Extending horizontally over the substrate 52 is an n-type 1st fin 54. Embedded in the 1st fin 54 are the 1st PG 20 and the $1^{st}$ PD 44. A gate structure 56 extends over the $1^{st}$ fin 54 to operate the 1st PG 20. Additionally, a gate structure 58 extends over the 1st fin 54 to operate the $1^{st}$ PD 44.

Also extending over the substrate 52 is an n-type $2^{nd}$ fin 60. Embedded in the $2^{nd}$ fin 60 are the $2^{nd}$ PG 32 and the $2^{nd}$ PD 48. A gate structure 62 extends over the $2^{nd}$ fin 60 to operate the $2^{nd}$ PG 32. Additionally, a gate structure 64 extends over the $2^{nd}$ fin 60 to operate the $2^{nd}$ PD 48.

Finally, a pair of p-type $3^{rd}$ and $4^{th}$ fins 66 and 68 extend over the substrate 52. Embedded in the $3^{rd}$ fin 66 is the $1^{st}$ PU 42. Embedded in the $4^{th}$ fin 68 is the $2^{nd}$ PU 46. Note though, that the gate structure 58, which enables the $1^{st}$ PD 44, also enables the $1^{st}$ PU 42. Also the gate structure 64, which enables the $2^{nd}$ PD 48, also enables the $2^{nd}$ PU 46.

Due to their horizontal design, the source/drain (S/D) regions of each of the transistors 20, 32, 42, 44, 46 and 48 are embedded in the fins on either side of the gate structures 56, 58, 62 and 64. As such, reducing the overall footprint in the horizontal direction becomes increasingly more challenging with increased downsizing.

Figure 4:
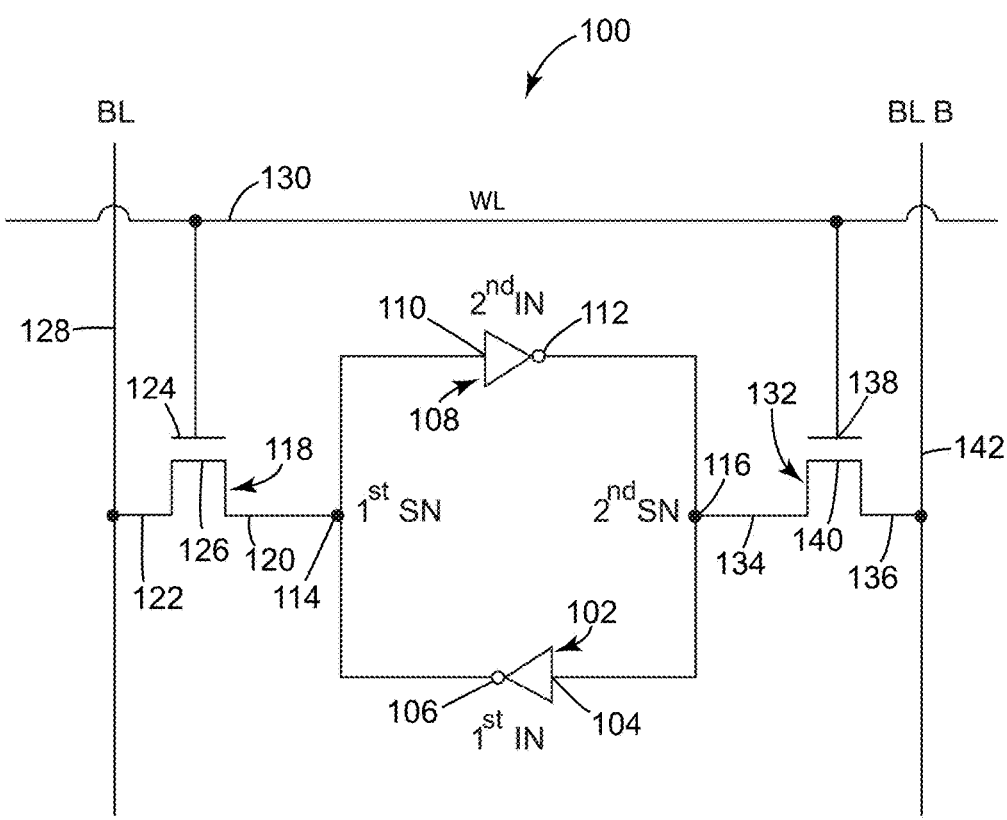
FIG. 4 is a schematic of an exemplary embodiment of a vertical SRAM cell structure showing 1st and 2nd pass gate transistors and a pair of cross coupled 1$^{st}$ and 2$^{nd}$ inverters in accordance with the present invention.

Referring to FIG. 4, a schematic of an exemplary embodiment of a vertical SRAM cell 100 (or vertical SRAM cell structure 100), in accordance with the present invention, is shown. In its most basic form, the SRAM cell 100 includes a $1^{st}$ inverter ($1^{st}$ IN) 102 having a $1^{st}$ inverter input 104 and a $1^{st}$ inverter output 106. SRAM cell 100 also includes a $2^{nd}$ inverter ($2^{nd}$ IN) 108 having a $2^{nd}$ inverter input 110 and a $2^{nd}$ inverter output 112. The $1^{st}$ inverter 102 and $2^{nd}$ inverter 108 are electrically cross-coupled to form a $1^{st}$ storage node ($1^{st}$ SN) 114 and a $2^{nd}$ storage node ($2^{nd}$ SN) 116. More specifically, the $1^{st}$ inverter output 106 electrically contacts the $2^{nd}$ inverter input 110 to form the $1^{st}$ storage node 114. Additionally, the $1^{st}$ inverter input 104 electrically contacts the $2^{nd}$ inverter output 112 to form the $2^{nd}$ SN 116. By virtue of the cross-coupling, the two storage nodes 114, 116 will always have two opposing output signals and the SRAM cell 100 will always have two stable logic states. That is, the first logic state includes a logic 1 (or voltage high signal) at the $1^{st}$ storage node 114 and a logic 0 (or voltage low signal) at the $2^{nd}$ storage node 116. The second logic state includes a logic 0 at the $1^{st}$ storage node 114 and a logic 1 at the $2^{nd}$ storage node 116.

A first ($1^{st}$), typically n-type, pass gate (PG) transistor 118 is electrically connected to the $1^{st}$ storage node 114 through its drain region 120. The source region 122 of the $1^{st}$ PG transistor 118 is connected to a bit line (BL) 128. A gate structure 124 of the $1^{st}$ PG transistor 118 is connected to a word line (WL) 130. The gate structure 124 is operative to control electrical flow through a channel 126 of the $1^{st}$ PG transistor 118. That is, when the gate structure 124 is activated by a logic high signal from the word line 130, current will flow through the channel 126 from the source region 122 to the drain region 120 of the $1^{st}$ PG transistor 118.

It should be noted that the source regions, such as source region 122, and the drain regions, such as drain region 120, for all the transistors in SRAM cell 100 can function interchangeably as either source or drain regions depending on application (for example, on application of a read operation or an application of a write operation of SRAM cell 100). Therefore, these source and drain regions may be referred to herein as source/drain (S/D) regions. Accordingly, source region 122 may also be referred to as S/D region 122, and drain region 120 may also be referred to as S/D region 120.

A second ($2^{nd}$), typically n-type, PG transistor 132 is electrically connected to the $2^{nd}$ storage node 116 through its S/D region 134. The S/D region 136 of the $2^{nd}$ PG transistor 132 is connected to a bit line bar (BLB) 142 (collectively, the BL 128 and BLB 142 being referred to herein as the "bit lines"). The gate structure 138 of the $2^{nd}$ PG transistor 132 is connected to the WL 130. The gate structure 138 is operative to control electrical flow through a channel 140 of the $2^{nd}$ PG transistor 132. That is, when the gate structure 138 is activated by a logic high signal from the word line 130, current will flow through the channel 140 from the S/D region 136 (which is functioning as a source region in this application) to the S/D region 134 (which is functioning as a drain region in this application) of the $2^{nd}$ PG transistor 132.

Figure 5:
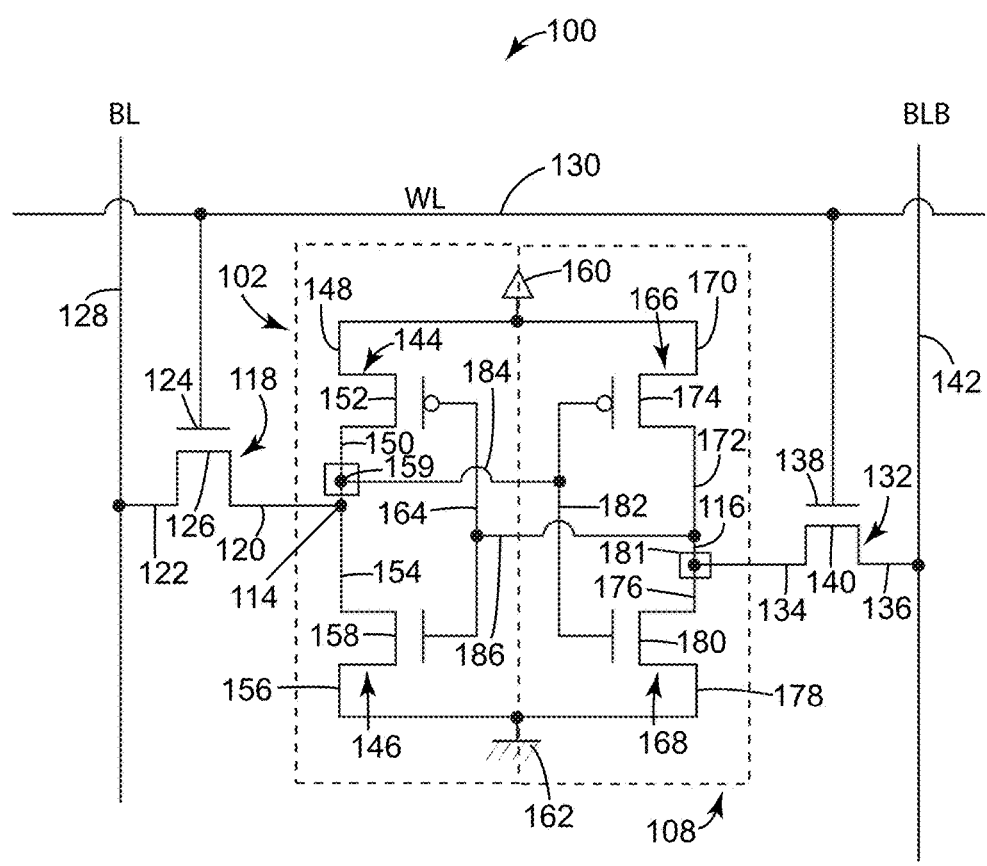
FIG. 5 is a schematic of the vertical SRAM cell structure of FIG. 4 showing the 1$^{st}$ inverter as having a 1$^{st}$ PU and a 1$^{st}$ PD transistor and the 2$^{nd}$ inverter as having a 2$^{nd}$ PU and a 2$^{nd}$ PD transistor in accordance with the present invention.

Referring to FIG. 5, a schematic of an exemplary embodiment of the vertical SRAM cell 100 with a more detailed schematic view of the $1^{st}$ and $2^{nd}$ inverters 102, 108 in accordance with the present invention is shown. The $1^{st}$ inverter 102 of SRAM cell 100 commonly includes a first, typically p-type, pull-up (PU) transistor 144 and a first, typically n-type, pull-down (PD) transistor 146. The $1^{st}$ PU transistor 144 has a S/D region 148 (which functions herein as a source region) and a S/D region 150 (which functions herein as a drain region). The S/D regions 148, 150 are connected therebetween by a channel 152. The $1^{st}$ PD transistor 146 has a S/D region 154 (which functions herein as a source region) and a S/D region 156 (which functions herein as a drain region). The S/D regions 154, 156 are connected therebetween by a channel 158.

The S/D region 150 of the $1^{st}$ PU transistor 144 is electrically connected to the S/D region 154 of the $1^{st}$ PD transistor 146 through a $1^{st}$ metal contact 159. The $1^{st}$ metal contact 159 is being used in this exemplary embodiment to provide electrical continuity between the p-type S/D region 150 of transistor 144 and the n-type S/D region 154 of transistor 146. If the p-type S/D region 150 were to make direct contact with the n-type S/D region 154, an n-p junction would be formed that would significantly impede the flow of electricity.

It is important to note that the $1^{st}$ metal contact 159 is disposed solely on sidewalls 192, and not on any top surfaces 194, of the S/D regions 150 and 154. As will be explained in further detail herein, this advantageously provides further separation between the $1^{st}$ metal contact 159 and channels 152 and 158 of the $1^{st}$ PU and $1^{st}$ PD transistors 144, 146 relative to prior art SRAM cells.

The S/D region 148 of the $1^{st}$ PU transistor 144 is electrically connected with a supply voltage 160 (which may be designated herein as Vdd). The S/D region 156 of the $1^{st}$ PD transistor 146 is electrically connected with a voltage ground 162 (which may be designated herein as Vcc).

For purposes herein, the electrical contacts for the bit line 128, bit line bar 142, voltage supply 160 and voltage ground 162 may be designated collectively as the CA contacts 163. This is because CA contacts typically connect to the source drain regions of a transistor and utilize a system of interconnect lines (not shown) to connect to such external electrical sources as the voltage supply 160, voltage ground 162, bit line 128 and bit line bar 142.

Also for purposes herein, the electrical contacts for the word lines 130 may be designated collectively as the CB contacts 165. This is because CB contacts typically connect to the gate structures of a transistor and utilize a system of interconnect lines (not shown) to such external contacts as the word lines 130.

A $1^{st}$ common gate structure 164 is operatively connected to both the channel 152 of the $1^{st}$ PU transistor 144 and the channel 158 of the $1^{st}$ PD transistor 146. That is, the $1^{st}$ common gate structure 164 provides the gate structure which can simultaneously activate and deactivate the channels 152 and 158 of transistors 144 and 146 respectively.

The $2^{nd}$ inverter 108 of SRAM cell 100 commonly includes a second, typically p-type, pull-up (PU) transistor 166 and a second, typically n-type, pull-down (PD) transistor 168. The $2^{nd}$ PU transistor 166 has a S/D region 170 (which functions herein as a source region) and a S/D region 172 (which functions herein as a drain region). The S/D regions 170, 172 are connected therebetween by a channel 174. The $2^{nd}$ PD transistor 168 has a S/D region 176 (which functions herein as a source region) and a S/D region 178

(which functions herein as a drain region). The S/D regions 176, 178 are connected therebetween by a channel 180.

The S/D region 172 of the $2^{nd}$ PU transistor 166 is electrically connected to the S/D region 176 of the $2^{nd}$ PD transistor 168 through a $2^{nd}$ metal contact 181. The $2^{nd}$ metal contact 181 is being used in this exemplary embodiment to bridge the electrical continuity between the p-type S/D region 172 of transistor 166 and the n-type S/D region 176 transistor 168. If the p-type S/D region 172 were to make direct contact with the n-type S/D region 176, an n-p junction would be formed that would significantly impede the flow of electricity.

It is important to note that the $2^{nd}$ metal contact 181 is disposed solely on sidewalls 192, and not on any top surfaces 194, of the S/D regions 172 and 176. As will be explained in further detail herein, this advantageously provides further separation between the $2^{nd}$ metal contact 181 and channels 174 and 180 of the $2^{nd}$ PU and $2^{nd}$ PD transistors 166, 168 relative to prior art SRAM cells.

The S/D region 170 of the $2^{nd}$ PU transistor 166 is electrically connected with the supply voltage 160. The S/D region 178 of the $2^{nd}$ PD transistor 168 is electrically connected with the voltage ground 162.

A $2^{nd}$ common gate structure 182 is operatively connected to both the channel 174 of the $2^{nd}$ PU transistor 166 and the channel 180 of the $2^{nd}$ PD transistor 168. That is, the $2^{nd}$ common gate structure 182 provides the gate structure which can simultaneously activate and deactivate the channels 174 and 180 of transistors 166 and 168 respectively.

A $1^{st}$ cross-coupled contact 184 is in electrical contact with the $2^{nd}$ common gate structure 182 of the $2^{nd}$ inverter 108 and the $1^{st}$ metal contact 159 of the $1^{st}$ inverter 102 to provide electrical continuity between the $2^{nd}$ common gate structure 182 and the $1^{st}$ metal contact 159. A $2^{nd}$ cross-coupled contact 186 is in electrical contact with the $1^{st}$ common gate structure 164 of the $1^{st}$ inverter 102 and the $2^{nd}$ metal contact 181 of the $2^{nd}$ inverter 108 to provide electrical continuity between the $1^{st}$ common gate structure 164 and the $2^{nd}$ metal contact 181.

The $1^{st}$ cross-coupled contact 184 completes the formation of the $1^{st}$ storage node 114 by electrically connecting the output 106 (best seen in FIG. 4) of the $1^{st}$ inverter 102 to the input 110 (best seen in FIG. 4) of the $2^{nd}$ inverter 108. The output 106 of the $1^{st}$ inverter 102 includes electrical continuity to the S/D region 120 of the $1^{st}$ PG transistor 118, the S/D region 150 of the $1^{st}$ PU transistor 144, the S/D region 154 of the $1^{st}$ PD transistor 146 and the $1^{st}$ metal contact 159. The input 110 of the $2^{nd}$ inverter 108 includes electrical continuity to the $2^{nd}$ common gate structure 182.

It is important to note that, in this embodiment, the $1^{st}$ cross-coupled contact 184 physically contacts solely the $1^{st}$ metal contact 159 of the 1st inverter 102 and does not physically contact the S/D regions 120, 150 or 154 of the $1^{st}$ inverter 102. Electrical continuity from the $1^{st}$ cross-coupled contact 184 to the S/D regions 120, 150 and 154 is provided through the $1^{st}$ metal contact 159. As will be explained in further detail herein, this advantageously provides further separation between the $1^{st}$ cross-coupled contact 184 and channels 126, 152 and 158 of the $1^{st}$ inverter 102 relative to prior art SRAM cells.

The $2^{nd}$ cross-coupled contact 186 completes the formation of the $2^{nd}$ storage node 116 by electrically connecting the output 112 (best seen in FIG. 4) of the $2^{nd}$ inverter 108 to the input 104 (best seen in FIG. 4) of the $1^{st}$ inverter 102. The output 112 of the $2^{nd}$ inverter 108 includes electrical continuity to the S/D region 134 of the $2^{nd}$ PG transistor 132, the S/D region 172 of the $2^{nd}$ PU transistor 166, the S/D region 176 of the $2^{nd}$ PD transistor 168 and the $2^{nd}$ metal contact 181. The input 104 of the $1^{st}$ inverter 102 includes electrical continuity to the $1^{st}$ common gate structure 164.

It is important to note that, in this embodiment, the $2^{nd}$ cross-coupled contact 186 physically contacts solely the $2^{nd}$ metal contact 181 of the $2^{nd}$ inverter 108 and does not physically contact the S/D regions 134, 172 or 176 of the $2^{nd}$ inverter 108. Electrical continuity from the $2^{nd}$ cross-coupled contact 186 to the S/D regions 134, 172 and 176 is provided through the $2^{nd}$ metal contact 181. As will be explained in further detail herein, this advantageously provides further separation between the $2^{nd}$ cross-coupled contact 186 and channels 140, 174 and 180 of the $2^{nd}$ inverter 108 relative to prior art SRAM cells.

Figure 6A:
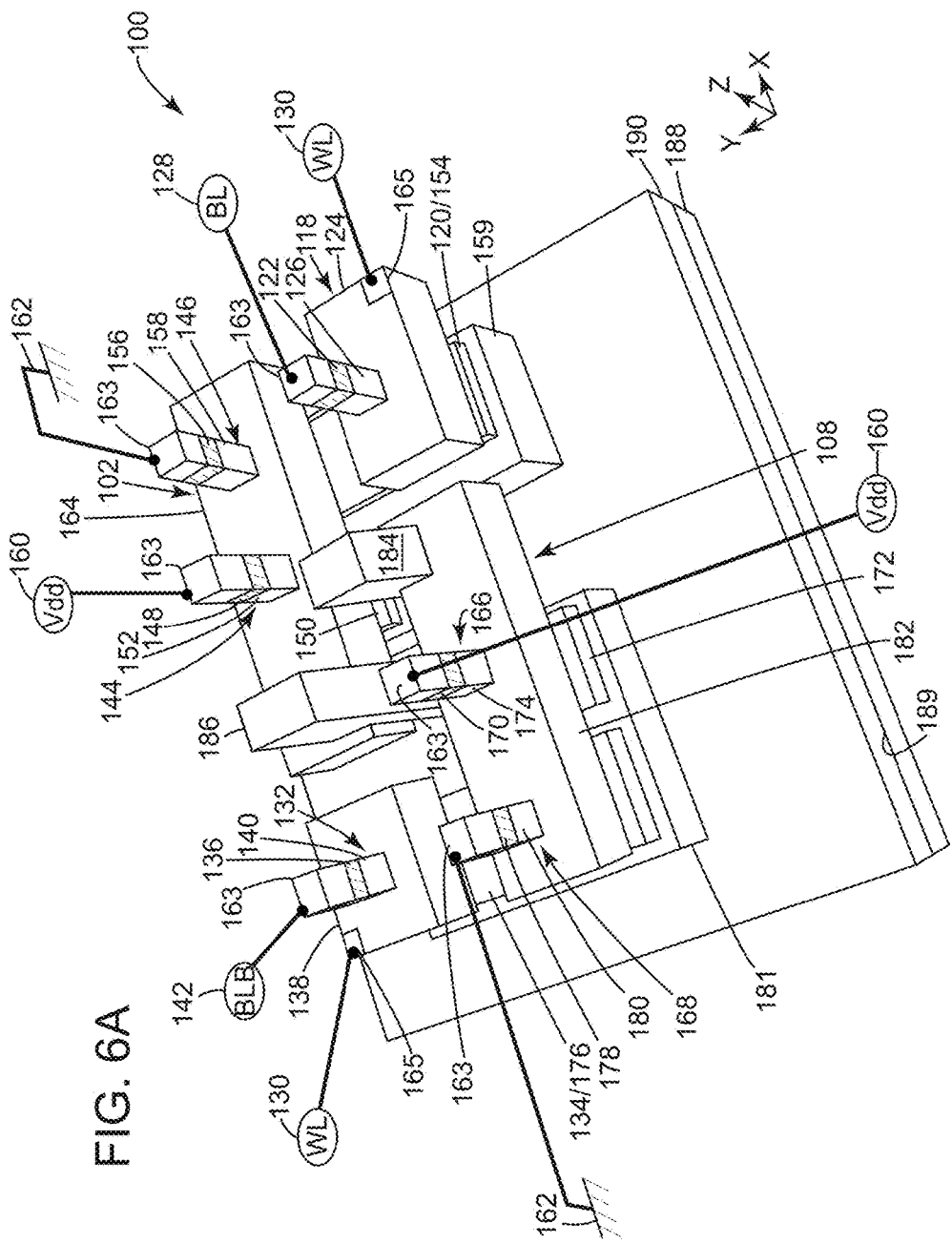
FIG. 6A is an exemplary embodiment of a perspective/top/right-side view of the structure of the vertical SRAM cell structure of FIG. 5 in accordance with the present invention.
Figure 6C:
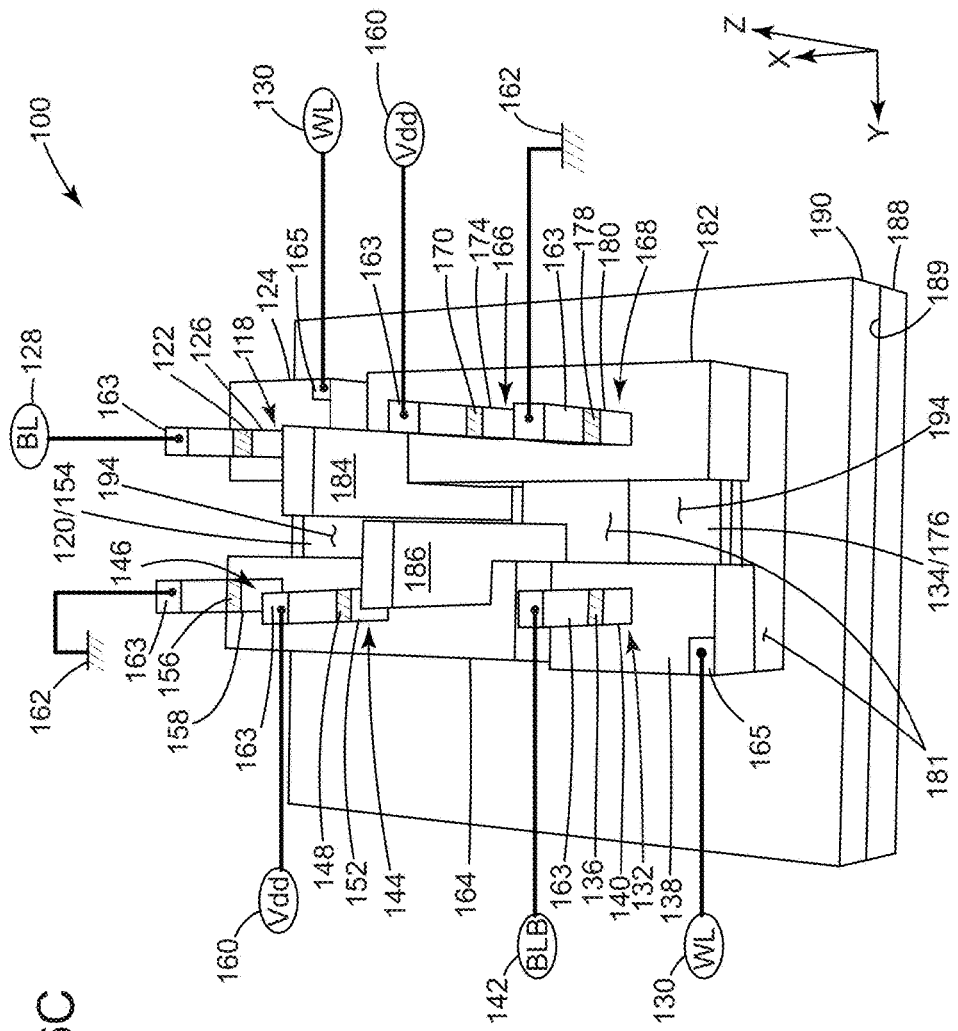
FIG. 6C is a perspective/top/front view of the SRAM cell structure of FIG. 6B taken along the line 6C-6C of FIG. 6B in accordance with the present invention.
Figure 6D:
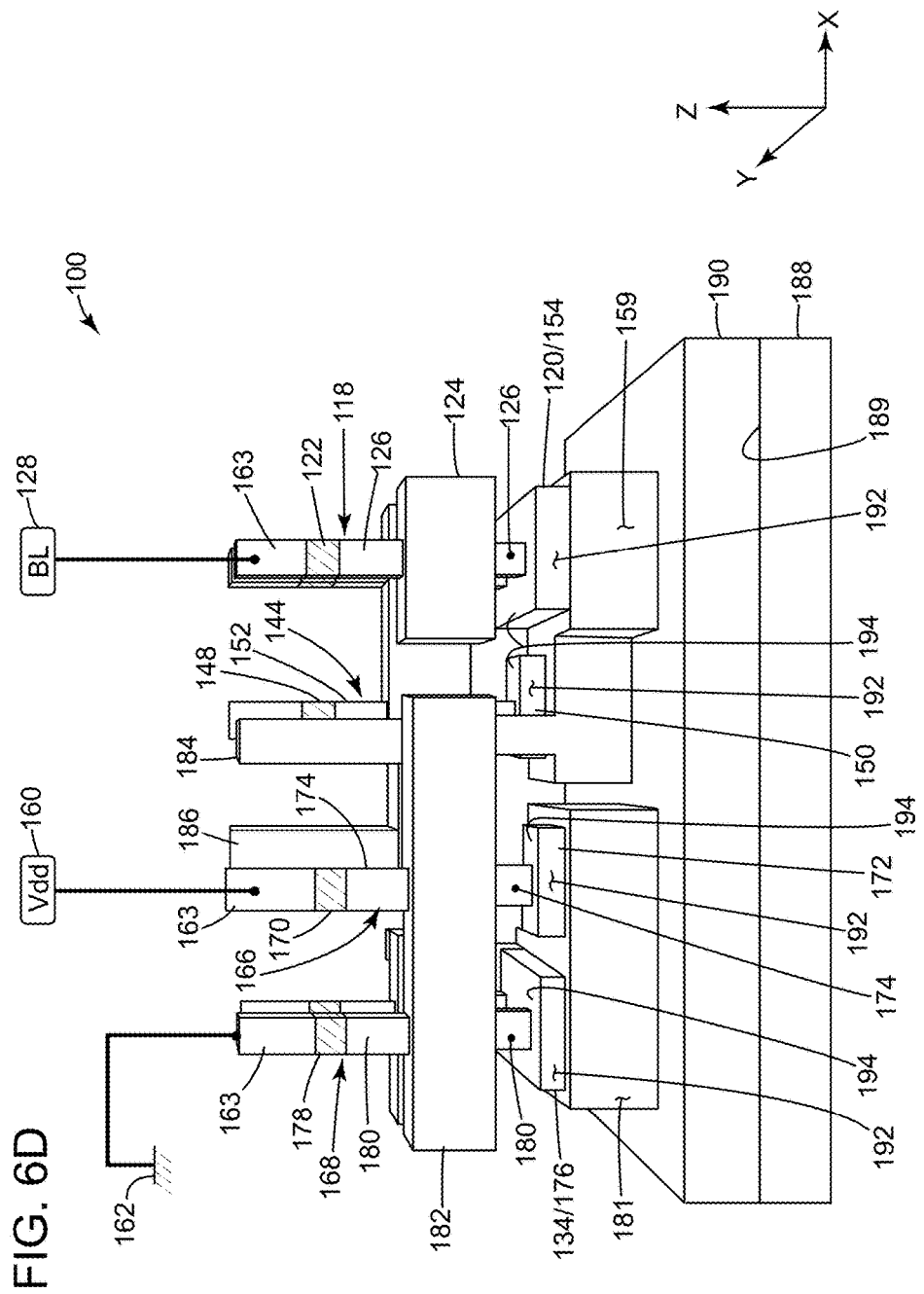
FIG. 6D is a perspective/lower/right-side view of the SRAM cell structure of FIG. 6B taken along the line 6D-6D of FIG. 6B in accordance with the present invention.
Figure 6E:
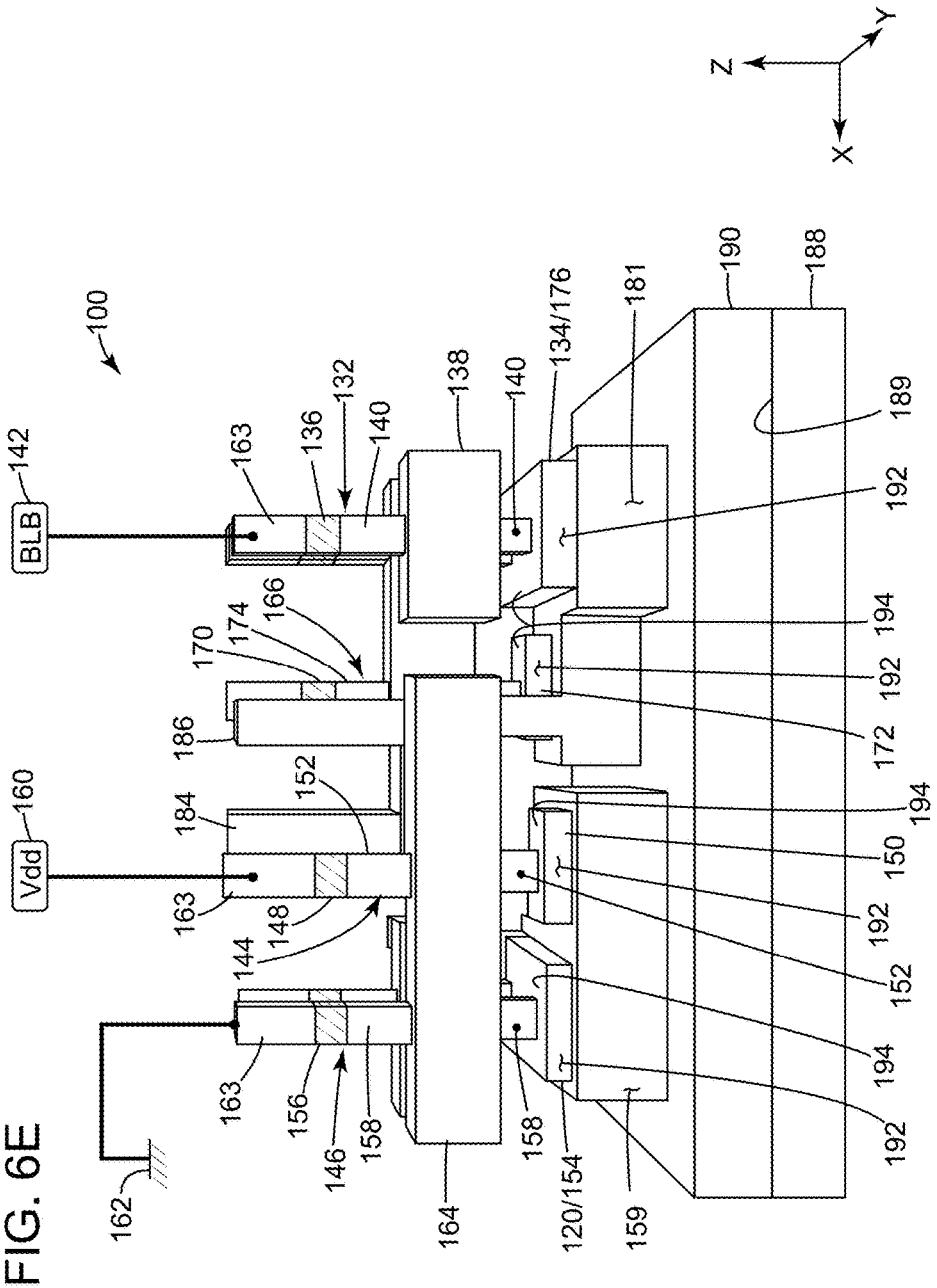
FIG. 6E is a perspective/lower/left-side view of the SRAM cell structure of FIG. 6B taken along the line 6E-6E of FIG. 6B in accordance with the present invention.

Referring to FIGS. 6A, 6B, 6C, 6D and 6E, various views of an exemplary embodiment of the physical structure of vertical SRAM cell 100 in accordance with the present invention is presented. More specifically, FIG. 6A is a perspective/top/right-side view of SRAM cell 100, FIG. 6B is a top view of SRAM cell 100, FIG. 6C is a perspective/top/front view of SRAM cell 100 taken along the line 6C-6C of FIG. 6B, FIG. 6D is a perspective/lower/right-side view of SRAM cell 100 taken along the line 6D-6D of FIG. 6B and FIG. 6E is a perspective/lower/left-side view of SRAM cell 100 taken along the line 6E-6E of FIG. 6B.

In this embodiment, the vertical SRAM cell 100 (or vertical SRAM cell structure 100) is disposed over, and extends upwards, from a substrate 188, such as a silicon substrate. A flowable oxide layer 190 is disposed over the substrate 188 and around the SRAM cell 100. The SRAM cell 100 is referred to herein as a vertical SRAM cell because all of the transistors that comprise the SRAM cell include a bottom S/D region disposed on the substrate 188, a channel that extends vertically upwards from the bottom S/D region and an upper S/D region connected to an upper end of the channel.

The channels, in this embodiment, are formed as nanowires extending vertically upwards. However, the channels may also be vertically upwards extending fins.

The $1^{st}$ inverter 102 includes the p-type $1^{st}$ PU transistor 144 and the n-type $1^{st}$ PD transistor 146. The bottom S/D region of the $1^{st}$ PU transistor 144 is the S/D region 150. The bottom S/D region of the $1^{st}$ PD transistor 146 is the S/D region 154. Both S/D regions 150, 154 are disposed on the substrate 188. Both S/D regions 150, 154 have a top surface 194 and sidewalls 192 (best seen in FIGS. 6D and 6E).

Since the S/D region 150 of the $1^{st}$ PU transistor 144 is p-type and the S/D region 154 of the $1^{st}$ PD transistor 146 is n-type, the $1^{st}$ metal contact 159 is used to provide electrical continuity between them. To provide such electrical continuity the metal contact 159 may be disposed only on two adjacent sidewalls 192 of the two S/D regions 150, 154. However, in this embodiment, the $1^{st}$ metal contact 159 is disposed on all sidewalls of both bottom S/D regions 150 and 154.

The channels 152 and 158 of the $1^{st}$ PU and $1^{st}$ PD transistors 144, 146, both extend vertically upwards from the top surfaces 194 of the S/D regions 150 and 154 respectively. Disposed on the upper ends of the channels 150, 154 are the upper S/D regions 148 and 156 of the transistors 144, 146. The voltage supply (Vdd) 160 is connected to the upper S/D region 148 through a CA contact 163. The voltage ground (Vcc) 162 is connected to the upper S/D region 156 through a CA contact 163.

The $1^{st}$ common gate structure 164 is operatively connected to both channels 152, 158 of the $1^{st}$ PU and $1^{st}$ PD transistors 144, 146. By well-known processes, the $1^{st}$ common gate structure 164 is disposed above the bottom S/D regions 150, 154 and below the upper S/D regions 148, 156 of the $1^{st}$ PU and $1^{st}$ PD transistors 144, 146.

For purposes of clarity, only the gate metal stacks of all of the gate structures 124, 138, 164 and 182 of the SRAM cell 100 are shown in FIGS. 6A through 6E. The well-known gate spacers, which insulate the gate metal stacks from the S/D regions and which would be located below and above the gate metal stacks, have not been drawn into FIGS. 6A through 6E. As such, the top surfaces 194 of the bottom S/D regions 120, 150, 154, 134, 172 and 176 are exposed for illustrative purposes. Also a top portion and lower portion of the channels 126, 140, 152, 158, 174 and 180, which extend vertically upwards from those top surfaces 194 and through the gate metal stacks, are also exposed for illustrative purposes.

Also for purposes herein, a top surface of the substrate 188 defines a substrate plane 189, wherein the longitudinal direction of the gate structures 124, 138, 164, 182 disposed over the top surface will be considered the X direction of the substrate plane 189 and the direction perpendicular to the X direction will be considered the Y direction of the substrate plane 189. Additionally, the direction perpendicular to the substrate plane 189 will be considered the vertical, or Z direction.

By drawing FIGS. 6A through 6E in this fashion, it can be seen that the $1^{st}$ metal contact 159 is disposed on the sidewalls 192, and not on the upper surfaces 194, of the bottom S/D regions 150, 154 of the $1^{st}$ PU and $1^{st}$ PD transistors 144, 146. Advantageously, by keeping the $1^{st}$ metal contact 159 off of the top surfaces 194 of the bottom S/D regions 150, 154, the chance of the $1^{st}$ metal contact touching and contaminating the channels 152, 158 of the $1^{st}$ PU and $1^{st}$ PD transistors 144, 146 are greatly reduced relative to prior art SRAM cells.

The bottom S/D region of the $1^{st}$ PG transistor 118 is the S/D region 120, which is disposed on the substrate 188. The S/D region 120 also has a top surface 194 and sidewalls 192 (best seen in FIGS. 6D and 6E).

Since the bottom S/D region 120 of the $1^{st}$ PG transistor 118 is n-type and the bottom S/D region 154 of the $1^{st}$ PD transistor 146 is also n-type, the S/D regions 120, 154 are formed as a single common bottom S/D region in this embodiment and may be referred to herein as S/D region 120/154. However, in other embodiments, the two S/D regions 120, 154 may be completely separate.

The channel 126 of the $1^{st}$ PG transistors 118 extends vertically upwards from the top surface 194 of the S/D region 120/154. Disposed on the upper end of the channel 126 is the upper S/D region 122 of the $1^{st}$ PG transistor 118. The bit line 128 is connected to the upper S/D region 122 through a CA contact 163.

The gate structure 124 is operatively connected to the channel 126 of the $1^{st}$ PG transistor 118. By well-known processes, the gate structure 124 is disposed above the bottom S/D region 120/154 and below the upper S/D region 122 of the $1^{st}$ PG transistor 118. The word line 130 is electrically connected to the gate structure 124 through a CB contact 165.

It can be seen that, in this embodiment, the $1^{st}$ metal contact 159 is also disposed on the sidewalls 192, and not on the top surface 194, of the bottom S/D region 120/154 of the $1^{st}$ PG transistor 118. As such, the chance of the $1^{st}$ metal contact 159 touching and contaminating the channel 120 of the $1^{st}$ PG transistor 118 is greatly reduced relative to prior art SRAM cells.

The $2^{nd}$ inverter 108 includes the p-type $2^{nd}$ PU transistor 166 and the n-type $2^{nd}$ PD transistor 168. The bottom S/D region of the $2^{nd}$ PU transistor 166 is the S/D region 172. The bottom S/D region of the $2^{nd}$ PD transistor 168 is the S/D region 176. Both S/D regions 172, 176 are disposed on the substrate 188. Both S/D regions 172, 176 have a top surface 194 and sidewalls 192 (best seen in FIGS. 6D and 6E).

Since the S/D region 172 of the $2^{nd}$ PU transistor 166 is p-type and the S/D region 176 of the $2^{nd}$ PD transistor 168 is n-type, the $2^{nd}$ metal contact 181 is used to provide electrical continuity between them. To provide such electrical continuity the metal contact 181 may be disposed only on two adjacent sidewalls 192 of the two S/D regions 172, 176. However, in this embodiment, the $2^{nd}$ metal contact 181 is disposed on all sidewalls 192 of both bottom S/D regions 172 and 176.

The channels 174 and 180 of the $2^{nd}$ PU and $2^{nd}$ PD transistors 166, 168, both extend vertically upwards from the top surfaces 194 of the S/D regions 172 and 176 respectively. Disposed on the upper ends of the channels 174, 180 are the upper S/D regions 170 and 178 of the transistors 166, 168. The voltage supply (Vdd) 160 is connected to the upper S/D region 170. The voltage ground (Vcc) 162 is connected to the upper S/D region 178.

The $2^{nd}$ common gate structure 182 is operatively connected to both channels 174, 180 of the $2^{nd}$ PU and $2^{nd}$ PD transistors 166, 168. By well-known processes, the $2^{nd}$ common gate structure 182 is disposed above the bottom S/D regions 172, 176 and below the upper S/D regions 170, 178 of the $2^{nd}$ PU and $2^{nd}$ PD transistors 166, 168.

It can be seen that the $2^{nd}$ metal contact 181 is disposed on the sidewalls 192, and not on the upper surfaces 194, of the bottom S/D regions 172, 176 of the $2^{nd}$ PU and $2^{nd}$ PD transistors 166, 168. Advantageously, by keeping the $2^{nd}$ metal contact 181 off of the top surfaces 194 of the bottom S/D regions 172, 176, the chance of the $2^{nd}$ metal contact 181 touching and contaminating the channels 174, 180 of the $2^{nd}$ PU and $2^{nd}$ PD transistors 166, 168 are greatly reduced relative to prior art SRAM cells.

The bottom S/D region of the $2^{nd}$ PG transistor 132 is the S/D region 134, which is disposed on the substrate 188. The S/D region 134 also has a top surface 194 and sidewalls 192 (best seen in FIGS. 6D and 6E).

Since the bottom S/D region 134 of the $2^{nd}$ PG transistor 132 is n-type and the bottom S/D region 176 of the $2^{nd}$ PD transistor 168 is also n-type, the S/D regions 134, 176 are formed as a single common bottom S/D region in this embodiment and may be referred to herein as S/D region 134/176. However, in other embodiments, the two S/D regions 134, 176 may be completely separate.

The channel 140 of the $2^{nd}$ PG transistors 132 extends vertically upwards from the top surface 194 of the S/D region 134/176. Disposed on the upper end of the channel 140 is the upper S/D region 136 of the $2^{nd}$ PG transistor 132. The bit line bar 142 is connected to the upper S/D region 136.

The gate structure 138 is operatively connected to the channel 140 of the $2^{nd}$ PG transistor 132. By well-known processes, the gate structure 138 is disposed above the bottom S/D region 134/176 and below the upper S/D region 136 of the $2^{nd}$ PG transistor 132. The word line 130 is electrically connected to the gate structure 138 through a CB contact 165.

It can be seen that, in this embodiment, the $2^{nd}$ metal contact 181 is also disposed on the sidewalls 192, and not on the upper surface 194, of the bottom S/D region 134/176 of the 2$^{nd}$ PG transistor 132. As such, the chance of the 2$^{nd}$ metal contact 181 touching and contaminating the channel 140 of the 2$^{nd}$ PG transistor 132 is greatly reduced relative to prior art SRAM cells.

The 1$^{st}$ cross-coupled contact 184 is in electrical contact with the 2$^{nd}$ common gate structure 182 of the 2$^{nd}$ inverter 108 and the 1$^{st}$ metal contact 159 of the 1$^{st}$ inverter 102 to provide electrical continuity between the 2$^{nd}$ common gate structure 108 and the 1$^{st}$ metal contact 159. A 2$^{nd}$ cross-coupled contact 186 is in electrical contact with the 1$^{st}$ common gate structure 164 of the 1$^{st}$ inverter 102 and the 2$^{nd}$ metal contact 181 of the 2$^{nd}$ inverter 108 to provide electrical continuity between the 1$^{st}$ common gate structure 164 and the 2$^{nd}$ metal contact 181.

Advantageously, in this embodiment, the 1$^{st}$ and 2$^{nd}$ cross-coupled contacts 184, 186 land only on the 1$^{st}$ and 2$^{nd}$ metal contacts 159, 181 respectively. The 1$^{st}$ and 2$^{nd}$ cross-coupled contacts 184, 186 do not land on any top surfaces 194 of any bottom S/D regions. As such, the chance of the 1$^{st}$ and 2$^{nd}$ cross-coupled contacts 184, 186 touching and contaminating any of the channels 126, 140, 152, 158, 174, 180 is greatly reduced relative to prior art SRAM cells.

FIGS. 7-34 illustrate various methods of making the vertical SRAM cell 100, in accordance with the present invention. Among other advantages, the methods illustrated show how the 1$^{st}$ and 2$^{nd}$ metal contacts 159, 181 may be formed only on the sidewalls 192, and not on the top surfaces 194, of the bottom S/D regions 120/154, 134/176, 150 and 172. The methods illustrated also show how the 1$^{st}$ and 2$^{nd}$ cross-coupled contacts 184, 186 may be formed only on the 1$^{st}$ and 2$^{nd}$ metal contacts 159, 181, and not on the top surfaces 194 of the S/D regions 120/154, 134/176, 150 and 172.

Referring to FIG. 7, an exemplary embodiment of the vertical SRAM cell 100 at an intermediate stage of manufacture is presented. At this stage, a hardmask layer 196 (shown in phantom in FIG. 7), such as silicon nitride or similar, has been lithographically patterned and anisotropically etched into the substrate 188 to form perimeters of the bottom S/D regions 120/154, 134/176, 150 and 172. Additionally, the FOX layer 190 has been disposed over the bottom S/D regions.

The perimeters (or footprints) of the bottom S/D regions 120/154, 134/176, 150, 172 extend along the substrate plane 189 in both the X and Y directions. The perimeters of the bottom S/D regions are larger than the perimeters of the yet to be formed channels 126, 140, 152, 158, 174, 180, which extend vertically upwards from the bottom S/D regions.

Referring to FIG. 8, a cross-sectional view of the vertical SRAM cell 100 of FIG. 7 taken along the line 8-8 of FIG. 7 is presented. FIG. 8 shows the cross-sectional view of bottom S/D region 172, but the process flow that will be performed on region 172 would be representative of all such bottom S/D regions in this embodiment. The bottom S/D region 172 extends from the substrate 188 vertically in the Z direction to a height 198 that is equal to or above a final height 199 of the channels 126, 140, 152, 158, 174, 180 (In the embodiment illustrated in FIG. 8, the channel 174, extending above the final height of S/D region 172, is shown in dotted lines.). The FOX layer 190 is disposed around the perimeter of the bottom S/D region 172. The hardmask layer 196 is disposed over the top surface 194 of the bottom S/D region 172.

Referring to FIG. 9, a metal contact layer 200 is next disposed over the entire vertical SRAM cell 100 structure. The metal contact layer 200 may be disposed by atomic layer deposition or other similar process. The metal contact layer 200 may be comprised of such metals as tungsten (W), aluminum (Al), copper (Cu) or similar.

Referring to FIG. 10, next a 1$^{st}$ lithographic stack 202 is disposed over the metal contact layer 200. The 1$^{st}$ lithographic stack (or litho stack) 202 may be composed of several different kinds of layers, depending on such parameters as the application requirements, design or proprietary preferences or the like. In this embodiment, the litho stack 202 includes at least a top resist layer 204 and a bottom spin-on hardmask (SOH) layer 206.

The 1$^{st}$ litho stack 202 is next lithographically patterned to form a metal contact mask 208, which is disposed over the perimeters of the 1$^{st}$ and 2$^{nd}$ metal contacts 159, 181 (In the embodiment illustrated in FIG. 10, the metal contact shown is a portion of the 2$^{nd}$ metal contact 181). The 1$^{st}$ and 2$^{nd}$ metal contacts 159, 181 must be patterned to at least provide electrical continuity between the bottom S/D regions 150, 154 of the 1$^{st}$ PU and 1$^{st}$ PD transistors 144, 146 and the bottom S/D regions 172, 176 of the 2$^{nd}$ PU and 2$^{nd}$ PD transistors 166, 168. However, the metal contact mask 208 may also pattern the 1$^{st}$ and 2$^{nd}$ metal contacts 159, 181 to advantageously include any number of shapes and extensions, which can be used to provide landing areas for the 1$^{st}$ and 2$^{nd}$ cross-coupled contacts 184, 186.

Referring to FIG. 11, the exposed metal contact layer 200, that is not protected by the metal contact mask, is anisotropically etched away to expose the FOX layer 190. The metal contact mask 208 is then removed by such means as wet etching or similar.

Figure 12:
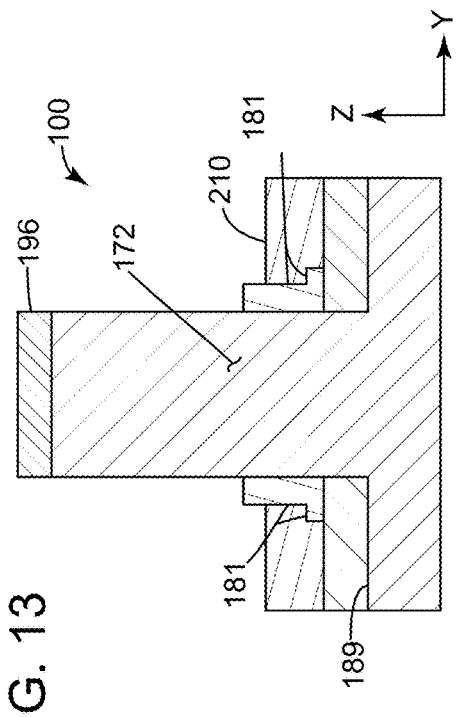
FIG. 12 is an exemplary embodiment of the vertical SRAM cell structure of FIG. 11 having an organic planarization layer (OPL) disposed thereon in accordance with the present invention.

Referring to FIG. 12, next an organic planarization layer (OPL) 210 is disposed over the entire structure 100. The OPL 210 may be deposited using a spin-on deposition process. The OPL layer may be composed of such materials as amorphous carbon, resist material or similar. Next the OPL layer 210 is recessed (or etched) down to a height 212 that is equal to or lower than a final height 214 of the bottom S/D regions. (In the embodiment of FIG. 12, the height 214 is the final height of bottom S/D region 172 above the substrate layer 188.)

Figure 13:
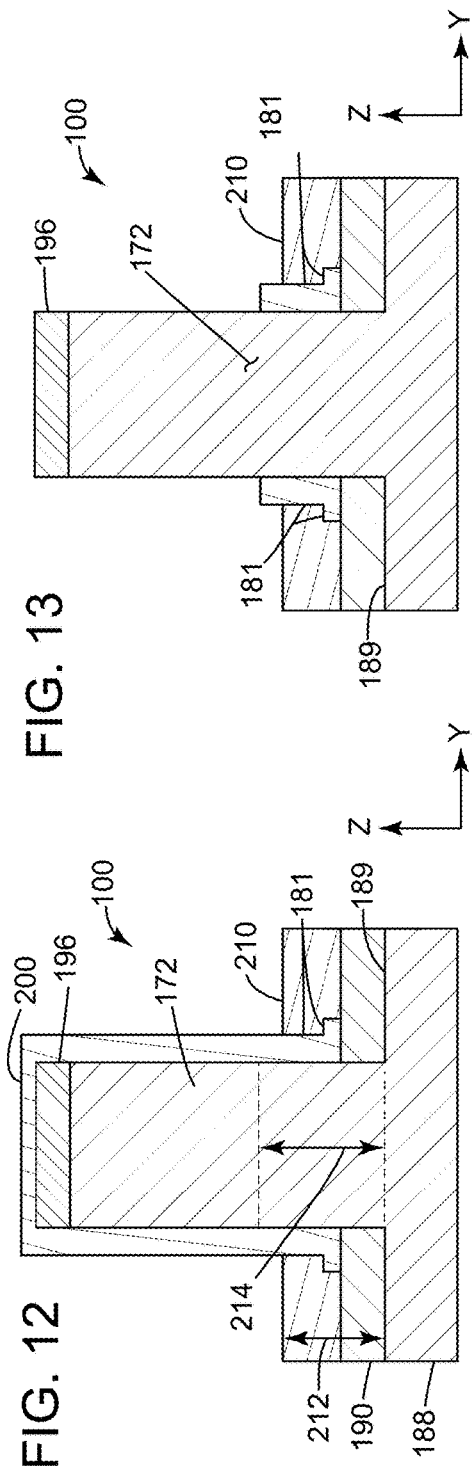
FIG. 13 is an exemplary embodiment of the vertical SRAM cell structure of FIG. 12 having exposed portions of the metal contact layer etched away from upper portions of the bottom S/D regions in accordance with the present invention.

Referring to FIG. 13, the exposed portion of the metal contact layer 200 is then etched away from the upper portion of the bottom S/D regions (S/D region 172 in this view). This may be done by wet etch or similar. This completes the formation of the 1$^{st}$ and 2$^{nd}$ metal contacts 159, 181.

Figure 14:
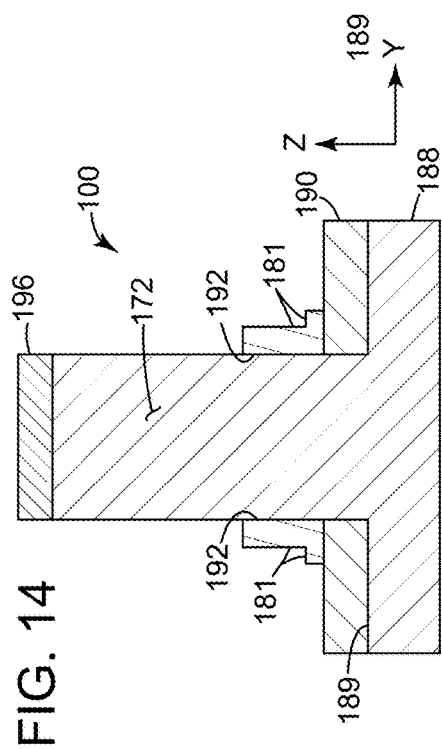
FIG. 14 is an exemplary embodiment of the vertical SRAM cell structure of FIG. 13 having any remaining OPL layer etched away to expose 1$^{st}$ and 2$^{nd}$ metal contacts disposed on sidewalls of the bottom S/D regions in accordance with the present invention.

Referring to FIG. 14, the remainder of the OPL layer 210 is then etched way to expose the 1$^{st}$ and 2$^{nd}$ metal contacts 159, 181. This also can be done by wet etch or similar.

Advantageously, the 1$^{st}$ and 2$^{nd}$ metal contacts 159, 181 are disposed on the sidewalls 192 of the bottom S/D regions 120/154, 134/176, 150, 172. The metal contacts 159, 181 are not disposed over the top surfaces 194 of the bottom S/D regions. Additionally, the metal contacts 159, 181 are not in contact with, and cannot contaminate, any channels 126, 140, 152, 158, 174, 180, since the channels have not been etched from the bottom S/D regions yet.

An alternative method of forming the metal contacts 159, 181 could be performed without the use of litho stack 202 or the formation of a metal contact mask 208. In that alternative method, the metal contact layer 200 may be disposed over the vertical SRAM cell structure 100. In that method, the spacing between the 1$^{st}$ PU and 1$^{st}$ PD transistors 144, 146 and the spacing between the 2$^{nd}$ PU and 2$^{nd}$ PD transistors 166, 168 must be sufficiently close enough to allow the metal contact layer 200 to substantially fill both spacings.

As such, the metal contact layer 200 may be reactive ion etched (RIE) from the top of the hardmask 196 which is disposed over the bottom S/D regions. The OPL layer 210 may then be disposed and recessed over the bottom S/D regions. The exposed metal contact layer 200 can then be removed.

However, this alternative method will only leave the metal contacts 159, 181 disposed over the metal sidewalls 192 of the bottom S/D regions. There will be no capability to form any extensions of the metal contacts 159, 181 over the FOX layer 190 that could be utilized for the landing of the cross-coupled contacts 184, 186.

Figure 15A:
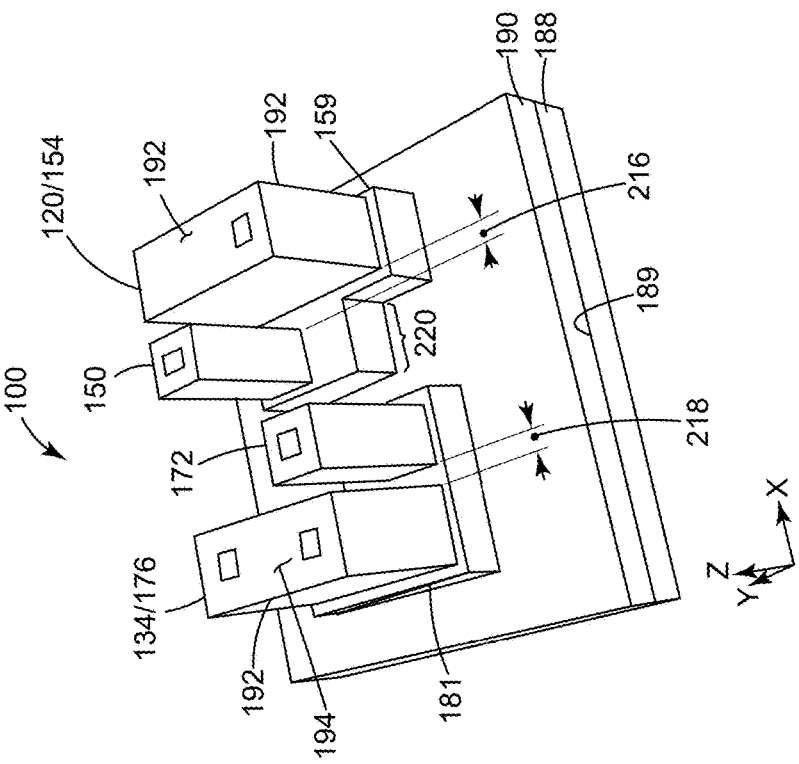
FIG. 15A is an exemplary embodiment of a top view of the vertical SRAM cell structure of FIG. 14 after formation of the 1$^{st}$ and 2$^{nd}$ metal contacts in accordance with the present invention.
Figure 15B:
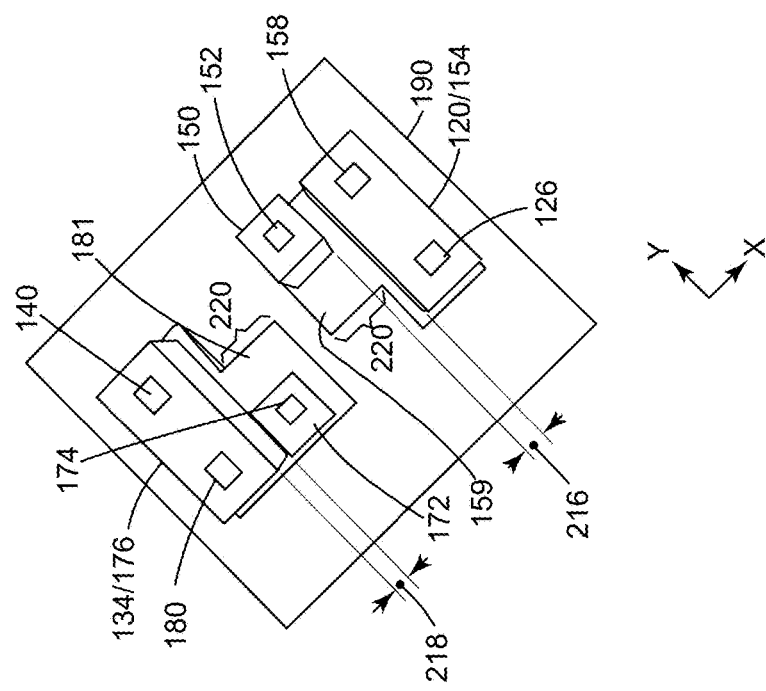
FIG. 15B is an exemplary embodiment of a perspective/top/right-side view of the vertical SRAM cell structure of FIG. 15A in accordance with the present invention.

Referring to FIGS. 15A and 15B, a top view and a perspective/top/right-side view respectively of the vertical SRAM cell 100 after formation of the $1^{st}$ and $2^{nd}$ metal contacts 159, 181 is presented. At this stage of the process flow, the metal contacts 159, 181 are fully formed on sidewalls 192 of the bottom S/D regions 120/154, 134/176, 150, 172 and the hardmask layer 196 has been removed. The hardmask layer may be removed by a wet etch process or similar.

The metal contacts 159, 181 are not disposed on the top surfaces 194 of the bottom S/D regions. Additionally, the metal contacts 159, 181 cannot contaminate the yet to be formed channels 126, 140, 152, 158, 174, 180 (shown in phantom) because they have not been etched yet.

The $1^{st}$ metal contact 159 must at least fill the space 216 between the bottom S/D region 150 of the $1^{st}$ PU transistor 144 and the bottom S/D region 120/154 of the $1^{st}$ PD transistor 146. The $2^{nd}$ metal contact 181 must at least fill the space 218 between the bottom S/D region 172 of the $2^{nd}$ PU transistor 166 and the bottom S/D region 134/176 of the $2^{nd}$ PD transistor 168.

However, in this embodiment, the bottom S/D regions 159, 181 are also formed with cross-coupled extensions 220, which are disposed on the FOX layer 190. The cross-coupled extensions 220 extend along the substrate plane 189 (in the X and Y directions) over an extension area 231 (best seen in FIG. 21). As will be shown in greater detail herein, the extension areas 231 of the cross-coupled extensions 220 are designed to provide a sufficiently large enough area for the cross-coupled contacts 184, 186 to land on without touching the bottom S/D regions. Preferably, the extension areas 231 of the cross-coupled extensions 220 are larger than an area footprint 232 (best seen in FIG. 21) over the substrate plane 189 of the cross-coupled contacts 184, 186.

Figure 16A:
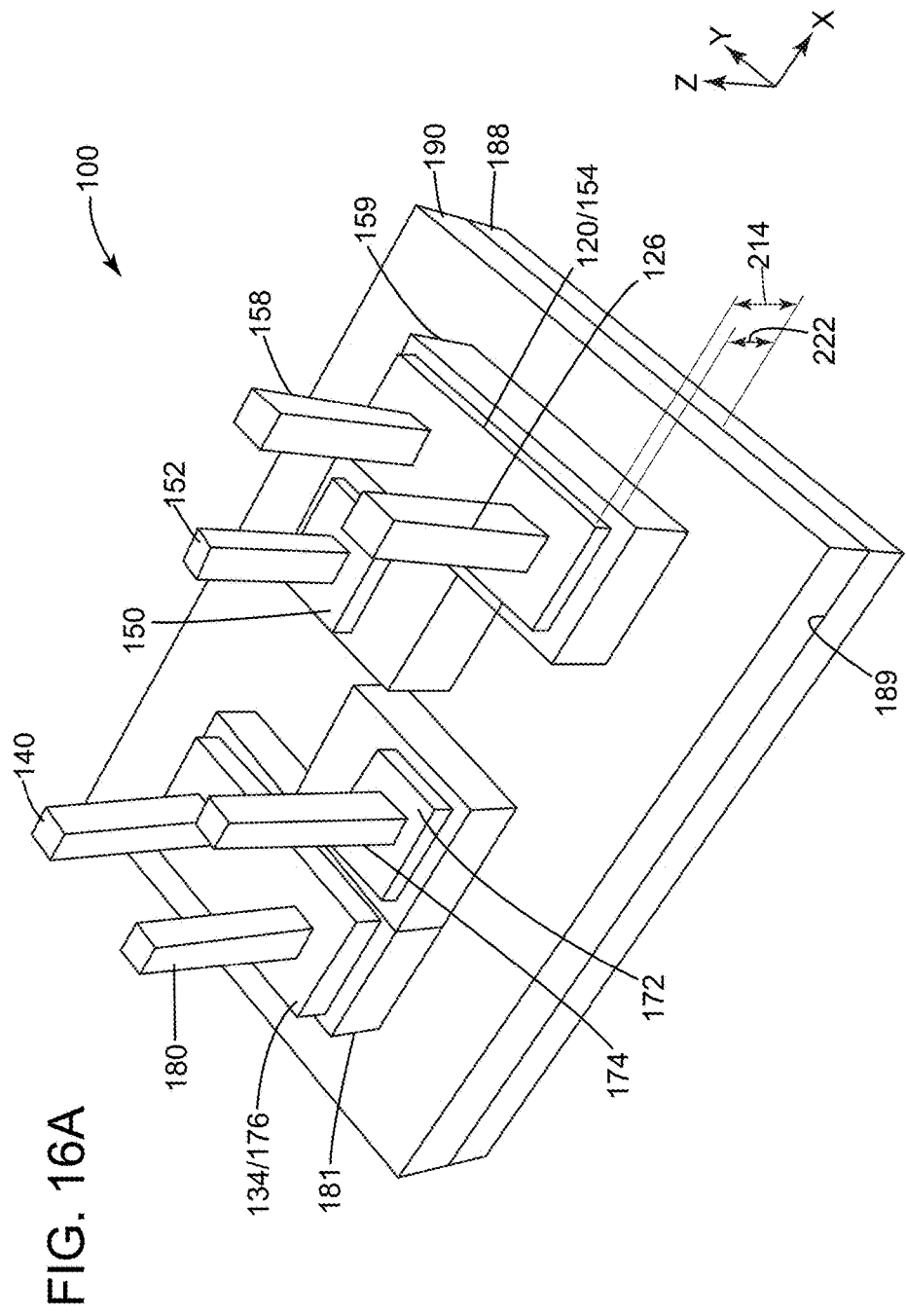
FIG. 16A is an exemplary embodiment of a perspective view of the vertical SRAM cell structure of FIG. 15A having vertically extending nanowire channels etched into the bottom S/D regions in accordance with the present invention.

Referring to FIG. 16A, next in the process flow, the channels 126, 140, 152, 158, 174, 180 are etched into the bottom S/D regions 120/154, 134/176, 150, 172. As such, the top surfaces 194 of the bottom S/D regions are recessed down to their final height 214. The final height 214 being equal to or greater than a height 222 of the metal contacts 159, 181 above the substrate layer 188.

In this embodiment, the channels 126, 140, 152, 158, 174, 180 are illustrated as nanowires. In this example, the cross-sectional area of the nanowires that is parallel to the substrate plane 189 is substantially square. However, the channels may be formed with a variety of other shapes and sizes as well. For example, the channels may be nanowires having a substantially round cross-sectional area.

Figure 16B:
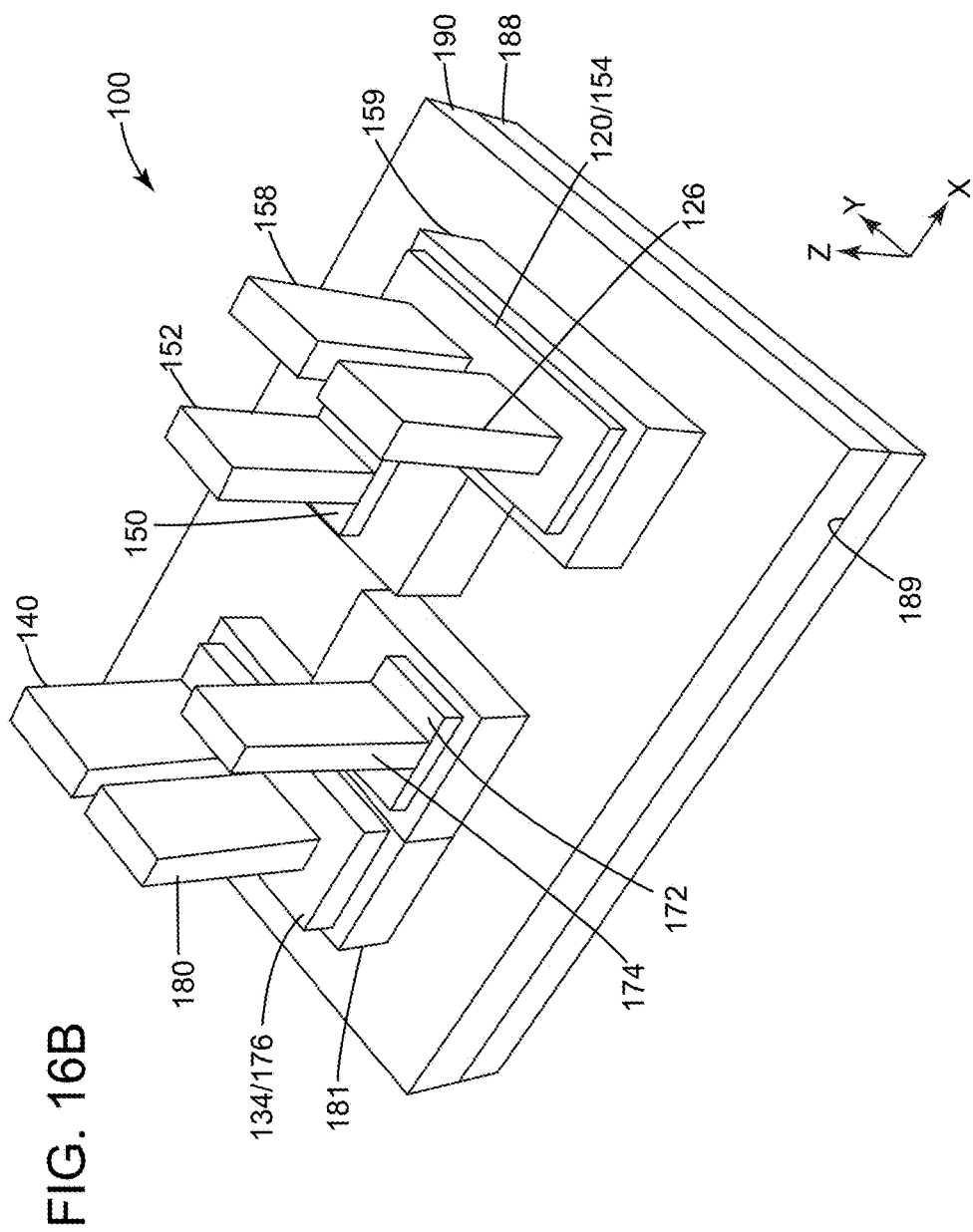
FIG. 16B is an alternative exemplary embodiment of a perspective view of the vertical SRAM cell structure of FIG. 15A having vertically extending fin channels etched into the bottom S/D regions in accordance with the present invention.

Referring to FIG. 16B, alternatively, the channels may be fins, rather than nanowires. In the embodiment illustrated in FIG. 16B, the cross-sectional area of the fins that is parallel to the substrate plane 189 is substantially rectangular, with the fins extending longitudinally in the Y direction.

Figure 17A:
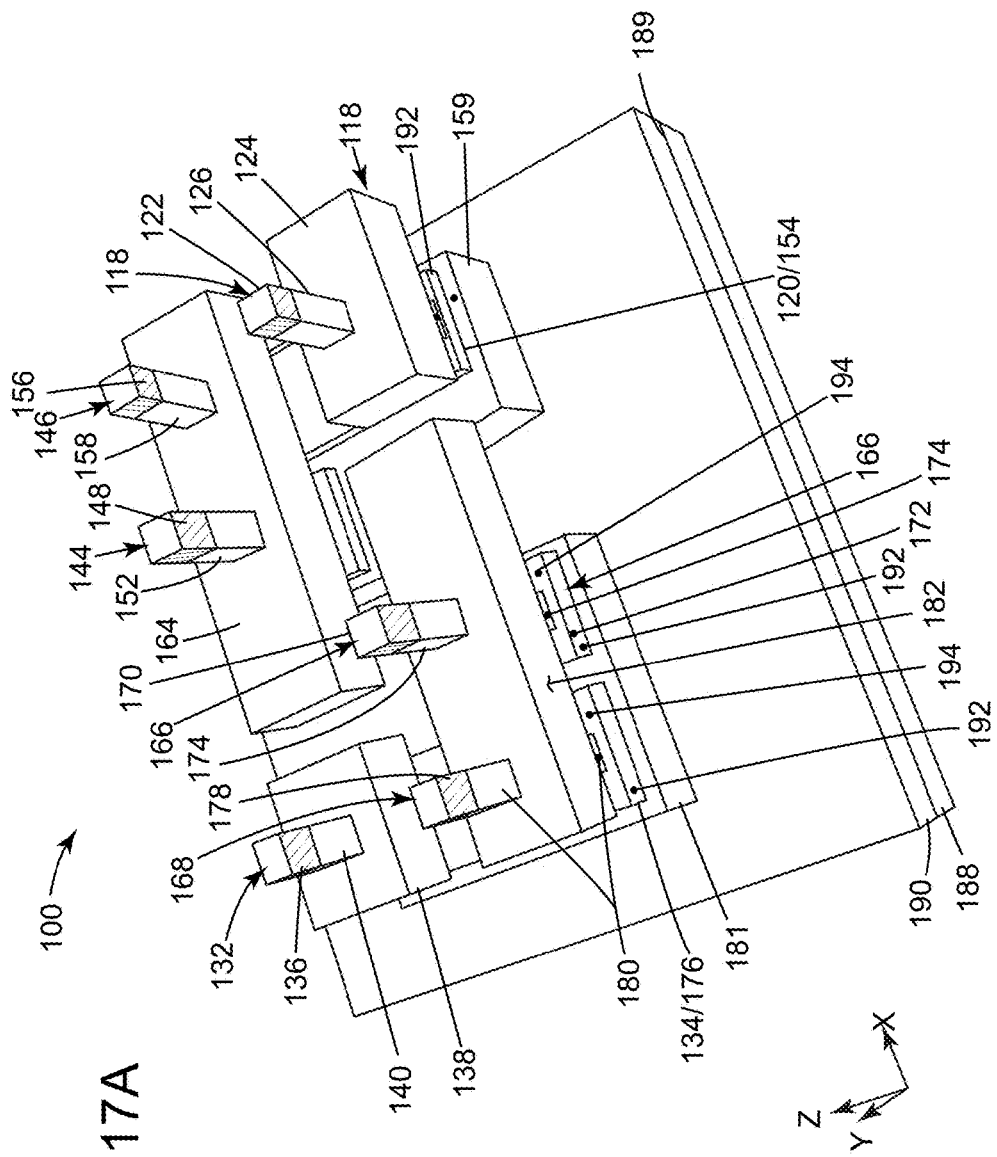
FIG. 17A is an exemplary embodiment of a perspective view of the vertical SRAM cell structure of FIG. 16A having gate structures disposed on the channels in accordance with the present invention.
Figure 17B:
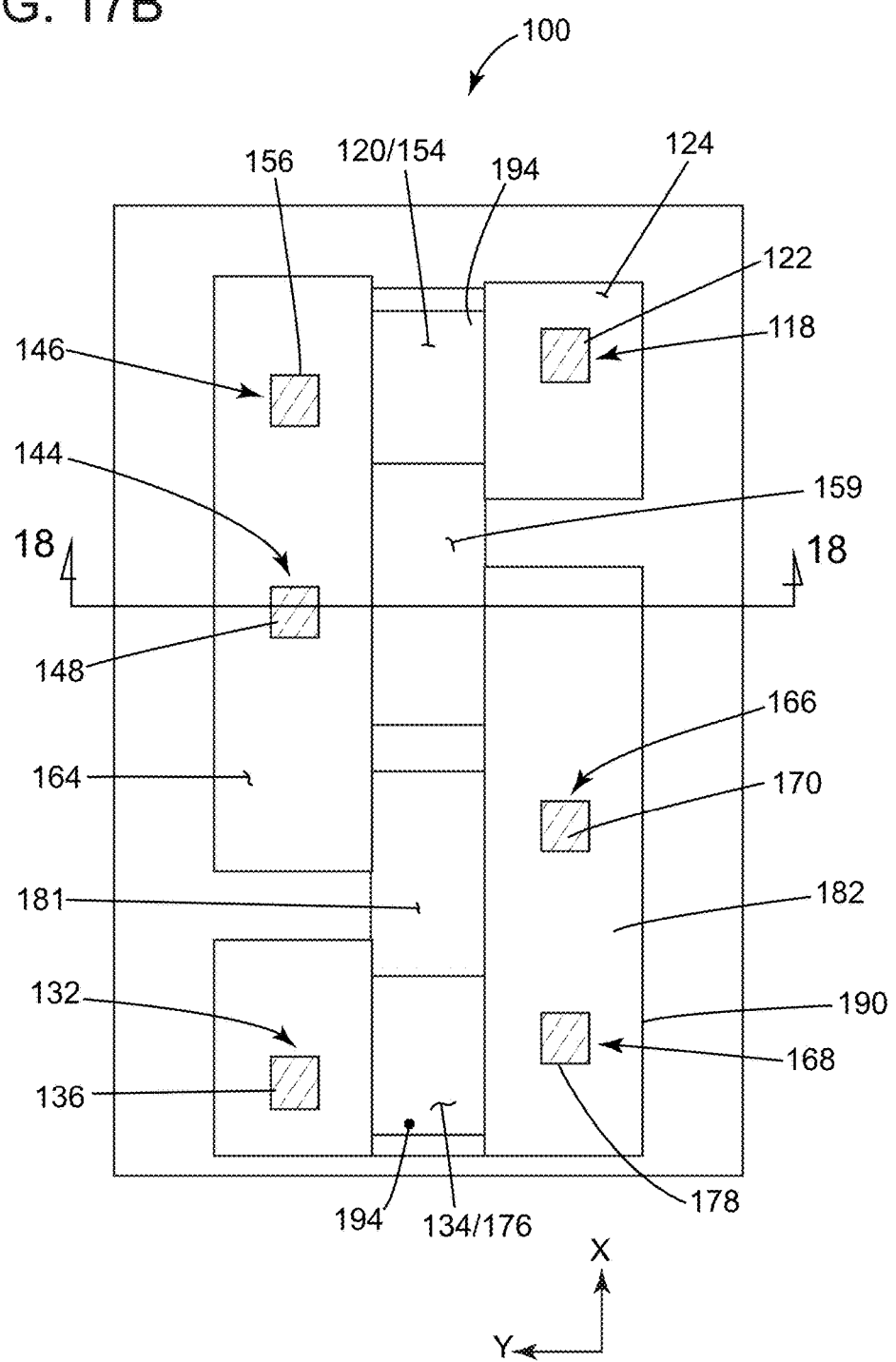
FIG. 17B is an exemplary embodiment of a top view of the vertical SRAM cell structure of FIG. 17A in accordance with the present invention.

Referring to FIGS. 17A and 17B, a perspective/right-side view and a top view are shown respectively of the vertical SRAM cell after the gate structures and upper S/D regions have been formed. Next, the gate structures 124, 138, for the $1^{st}$ and $2^{nd}$ PG transistors 118, 132, the $1^{st}$ common gate structure 164 for the $1^{st}$ PU and PD transistors 144, 146, as well as the $2^{nd}$ common gate structure 182 for the $2^{nd}$ PU and PD transistors 166, 168 are formed on the channels 126, 140, 152, 158, 174, 180 of those transistors. The gate structures may be formed by one or more well-known methods.

The gate structures include gate metal and gate spacers. The gate spacers (not shown) are composed of a dielectric material such as SiN, SiNC, SiBCN or similar. The gate metal is typically a stack of gate metals, which generally includes three main groups of structures (not shown). Those three main structures are: the gate dielectric layers (typically a high-k dielectric material), the work-function metal structures (typically TiN, TaN, TiCAl, other metal-nitrides or similar materials) and the gate electrode metal (typically Al, W, Cu or similar metal). The gate dielectric layers are used to electrically insulate the work-function metal structures and the gate electrodes from the substrate. The work-function metal structures are generally metal-nitrides that provide the work-function needed for proper transistor operation, but typically have 10 to 100 times larger resistivity than the gate electrodes. The gate electrodes are metals, such as tungsten, with a very low resistivity.

As discussed earlier herein, the gate spacers of the gate structures have not been illustrated in order to more clearly shown the channels 126, 140, 152, 158, 174, 180 of the transistors and the top surfaces 194 of the bottom S/D regions. With the gate spacers removed, it can be seen that the channels extend vertically from the bottom S/D regions and through the gate structures.

Disposed at the upper end of the channels are the upper S/D regions 122, 136, 148, 156, 170 and 178. The upper S/D regions may be epitaxially grown on the upper ends of the channels of those transistors.

Referring to FIG. 18, a cross-sectional view of FIG. 17B taken along the line 18-18 of FIG. 17B is presented. In the embodiment illustrated in FIG. 18, and in the embodiments illustrated in FIGS. 19-25 and 28-34, the thickness of the FOX layer 190 has been increased by further deposition of flowable oxide material earlier in the process flow. The FOX layer 190 now covers the structure 100 up to at least a height of the metal gate structures 124, 138, 164, 182 above the substrate layer 188. Additionally, the well-known gate spacers of the metal gate structures are still not shown for purposes of clarity.

An additional dielectric layer 224 has also been disposed over the entire vertical SRAM cell structure 100 and polished down so that it is substantially level. The dielectric layer 224 may also be a flowable oxide layer similar in composition to that of FOX layer 190.

FIG. 18 shows the cross-sectional view of the $1^{st}$ PU transistor 144 and $1^{st}$ metal contact 159 of the $1^{st}$ inverter 102 on the left side of structure 100. The $1^{st}$ metal contact 159 includes a cross-coupled extension 220. FIG. 18 also shows the cross-sectional view of the $2^{nd}$ common gate structure 182 of the $2^{nd}$ inverter 108.

As will be discussed in greater detail herein, the $1^{st}$ cross-coupled contact 184 will be formed in electrical contact with the $1^{st}$ metal contact 159 and the $2^{nd}$ common gate structure 182 to provide electrical continuity between the $1^{st}$ metal contact 159 and the $2^{nd}$ common gate structure 182. The process flow of how the $1^{st}$ and $2^{nd}$ cross-coupled contacts 184, 186 are formed is substantially the same and is detailed in the following figures.

Referring to FIG. 19, a $2^{nd}$ lithographic stack (or $2^{nd}$ litho stack) 226 has been disposed over the structure 100 and cross-coupled openings 228 have been patterned into the $2^{nd}$ litho stack 226. As with $1^{st}$ litho stack 202, the $2^{nd}$ litho stack 226 may include a top resist layer and a bottom SOH layer, as well as several other layers in between (not shown).

The cross-coupled openings 228 overlap a metal contact 159, 181 of one inverter 102, 108 and a common gate structure 164, 182 of the other inverter 102, 108. The openings 228 do not overlap any bottom S/D regions 120/154, 134/176, 150, 172. Accordingly, the cross-coupled openings 228 are disposed over the locations of the $1^{st}$ and $2^{nd}$ cross-coupled contacts 184, 186.

In this particular example, the cross-coupled opening 228 is disposed directly over the location of the $1^{st}$ cross-coupled contact 184. Since the method of formation of both the $1^{st}$ and $2^{nd}$ cross-coupled contacts 184, 186 is substantially the same, only the formation of the $1^{st}$ cross-coupled contact 184 will be illustrated.

Referring to FIG. 20, next the $2^{nd}$ litho stack 226 is removed by wet etching or similar. The cross-coupled opening 228 is then selectively anisotropically etched to form a cross-coupled trench 230. The trench 230 exposes a portion of the $2^{nd}$ common gate structure 182 of the $2^{nd}$ inverter 108 and a portion of cross-coupled extension 220 of the $1^{st}$ metal contact 159 of the $1^{st}$ inverter 102.

The anisotropic etching process may be done by a RIE process or similar. The RIE etching process must be selective enough to anisotropically etch away the dielectric layer 224 and FOX layer 190 without significantly etching the metal gate stack of the $2^{nd}$ common gate structure 182 or the $1^{st}$ metal contact 159. The cross-coupled trench 230 is targeted to land on the top surface of the metal gate stack of the $2^{nd}$ common gate structure 182 and the top surface of the $1^{st}$ metal contact 159. The cross-coupled trench 230 does not contact the sidewalls 192 or top surface 194 of the bottom S/D region 150.

Referring to FIG. 21, next the $1^{st}$ cross-coupled contact 184 is deposited into the cross-coupled trench 230. This can be done by first disposing a metal layer over the entire structure 100 and then polishing the metal layer down to a top surface 225 of the dielectric layer 224. This can be done utilizing a chemical-mechanical polishing (CMP) process or similar.

The $1^{st}$ cross-coupled contact 184 lands on the cross-coupled extension 220 of the $1^{st}$ metal contact 159. The $1^{st}$ cross-coupled contact 184 advantageously does not land on the bottom S/D region 150 of the $1^{st}$ PU transistor 144. This is at least partially due to the fact that the extension area 231 of the cross-coupled extension 220 of the $1^{st}$ metal contact 159 is larger than the area footprint 232 of the $1^{st}$ cross-coupled contact 184 where the cross-coupled contact 184 and metal contact 159 meet. As such, potential contact and contamination of the channel 152 by the cross-coupled contact 184 is greatly reduced compared to prior art methods of making such cross-coupled contacts.

This completes the formation of the $1^{st}$ cross-coupled contact 184. The formation of the $2^{nd}$ cross-coupled contact 186 is done utilizing substantially the same method.

Referring to FIG. 22, next a $3^{rd}$ litho stack 234 is disposed over the vertical SRAM cell structure 100. Upper S/D region openings 236 are patterned into the litho stack 234. The openings 236 are disposed directly above the upper S/D regions 122, 136, 148, 156, 170, 178 of the transistors in the vertical SRAM cell 100. In this particular example, the opening 236 is disposed directly over the upper S/D region 148 of the $1^{st}$ PU transistor 144.

The method of forming CA contacts 163 (such as the contacts for the bit line 128 bit line bar 142, voltage supply 160 and voltage ground 162) to the upper S/D regions 122, 136, 148, 156, 170, 178 is substantially the same. Therefore, only the method of formation of the CA contact 163 for the voltage supply (Vdd) 160 to the upper S/D region 148 of the $1^{st}$ PU transistor 144 will be illustrated.

Referring to FIG. 23, the upper S/D region opening 236 is next anisotropically etched to form an upper S/D region trench 238. The anisotropic etching process may be done by a RIE process or similar. The trench 238 is targeted to land on and expose a portion of the upper S/D region 148.

Figure 24:
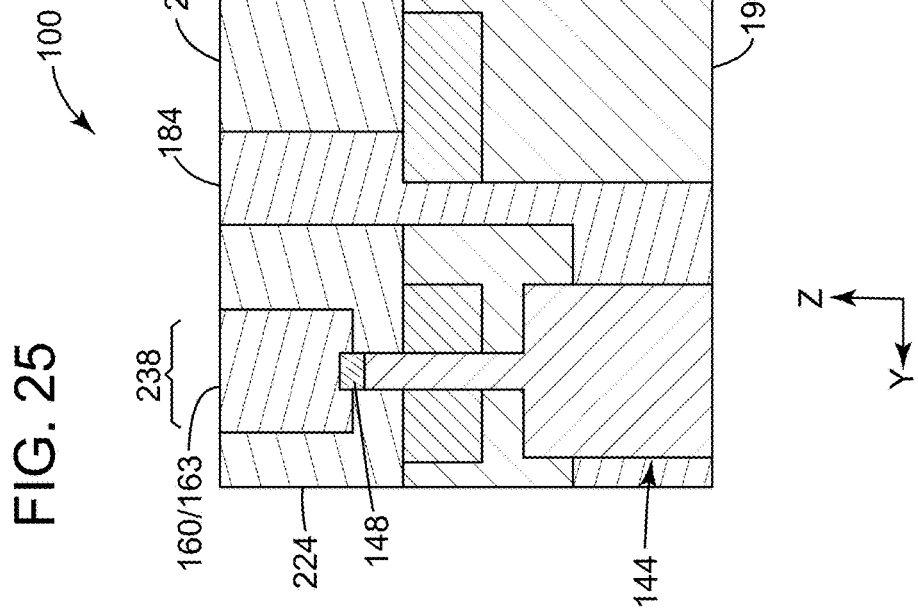
FIG. 24 is a cross-sectional view of an exemplary embodiment of the vertical SRAM cell structure of FIG. 23 having the litho stack removed in accordance with the present invention.

Referring to FIG. 24, the $3^{rd}$ litho stack 234 is next removed. This can be done by a wet etch process or similar.

Figure 25:
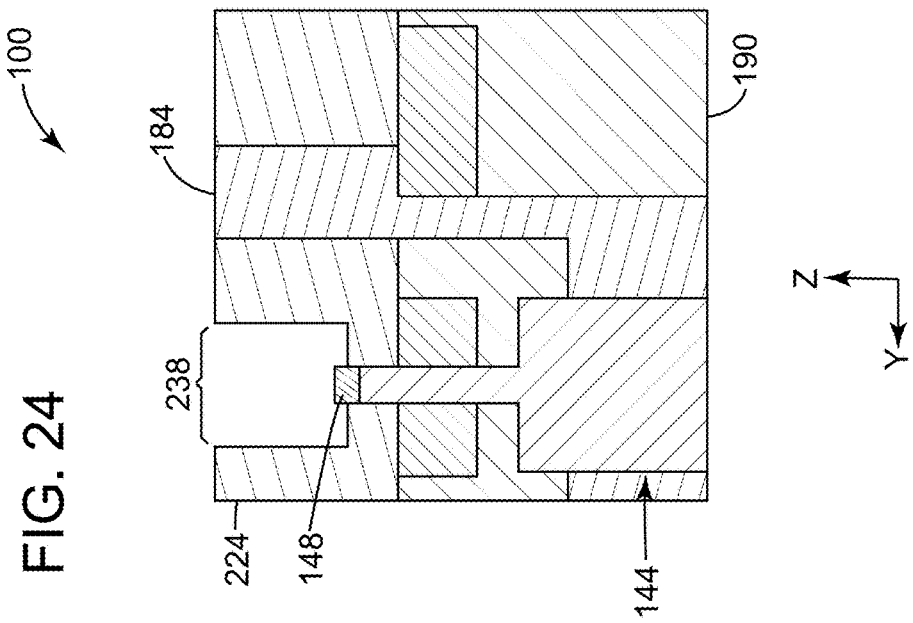
FIG. 25 is a cross-sectional view of an exemplary embodiment of the vertical SRAM cell structure of FIG. 24 having a CA contact disposed in the upper S/D region trench in accordance with the present invention.

Referring to FIG. 25, next the CA contact 163 for the voltage supply 160 is deposited into the upper S/D region trench 238. This can be done by first disposing a metal layer over the entire structure 100 and then polishing the metal layer down to the top surface 225 of the dielectric layer 224. This can be done utilizing a chemical-mechanical polishing (CMP) process or similar.

This completes the formation of the CA contact 163 for the voltage supply 160. The formation of the CA contacts 163 for the bit line 128, bit line bar 142 and voltage ground 162 are done utilizing substantially the same method.

Figure 26:
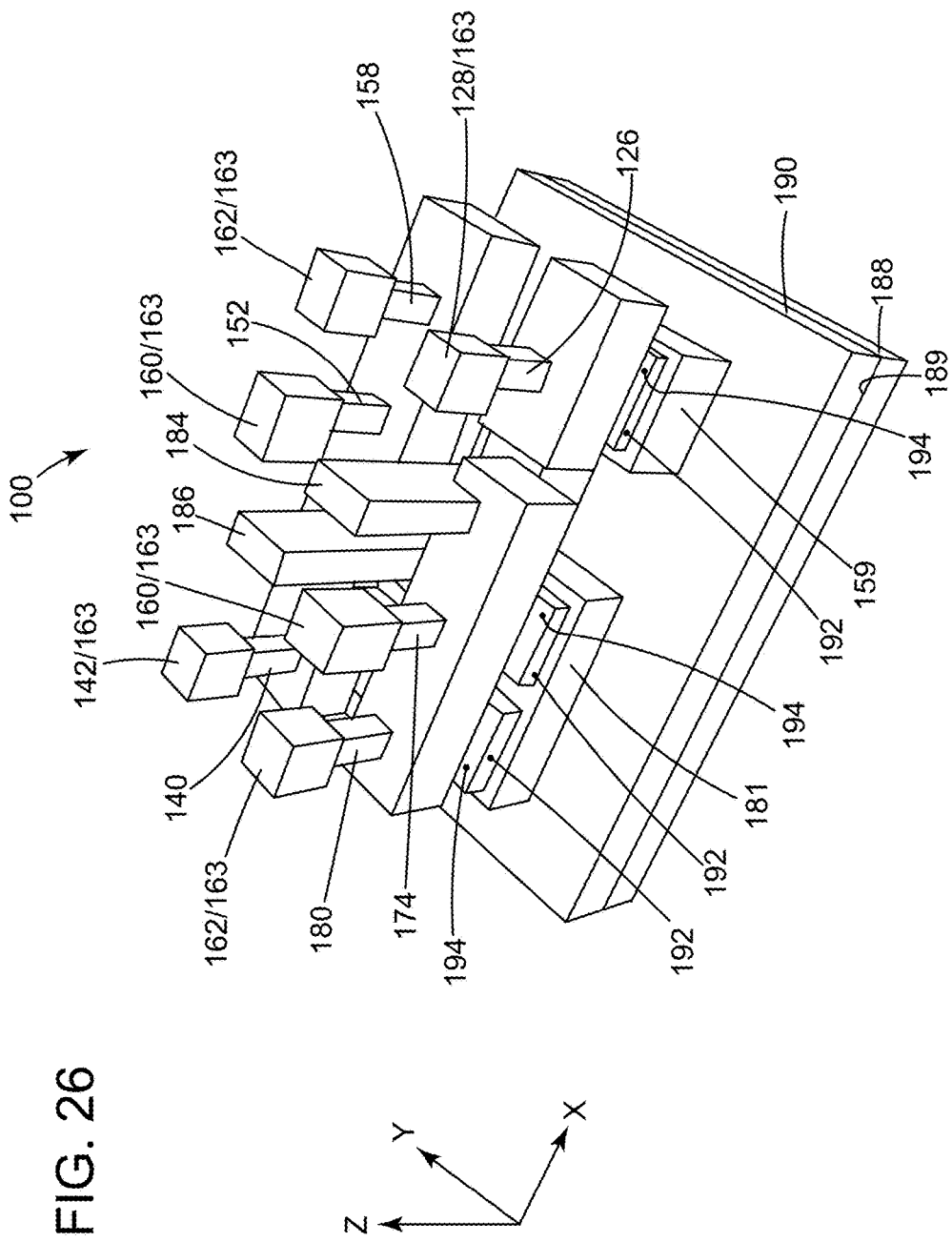
FIG. 26 is a perspective view of an exemplary embodiment of the vertical SRAM cell structure of FIG. 25 having a CA contact completed in accordance with the present invention.

Referring to FIG. 26, the completed vertical SRAM cell structure 100 is presented with all CA contacts 163 completed. That is, the electrical contacts 163 for the bit line 128, bit line bar 142, voltage supply 160 and voltage ground 162 are completed. Additionally, the $1^{st}$ cross-coupled contact 184 and $2^{nd}$ cross-coupled contact 186 are also completed. Further, $1^{st}$ and $2^{nd}$ metal contacts 159, 181 are disposed only on sidewalls 192 of the bottom S/D regions, which decreases the likelihood of contact between the metal contacts 159, 181 and the channels 126, 140, 152, 158, 174 and 180.

Figure 27:
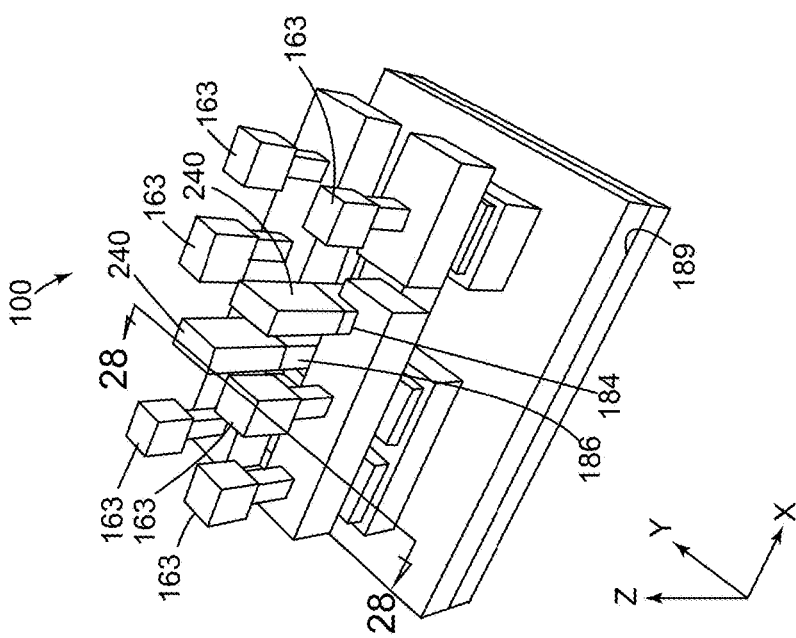
FIG. 27 is a perspective view of an alternative exemplary embodiment of the vertical SRAM cell structure of FIG. 26 having buried cross-coupled contacts buried by dielectric plugs in accordance with the present invention.

Referring to FIG. 27, a perspective view of an alternative embodiment of vertical SRAM cell structure 100 having buried cross-coupled contacts 184, 186 is presented. In this embodiment, the cross-coupled contacts 184, 186 are recessed and a dielectric plug 240 is disposed over them to reduce the possibility of shorting between the cross-coupled contacts 184, 186 and the CA contacts 163. The plug 240 may be a low-k dielectric plug and may be composed of silicon nitride (SiN) or similar.

Figure 28:
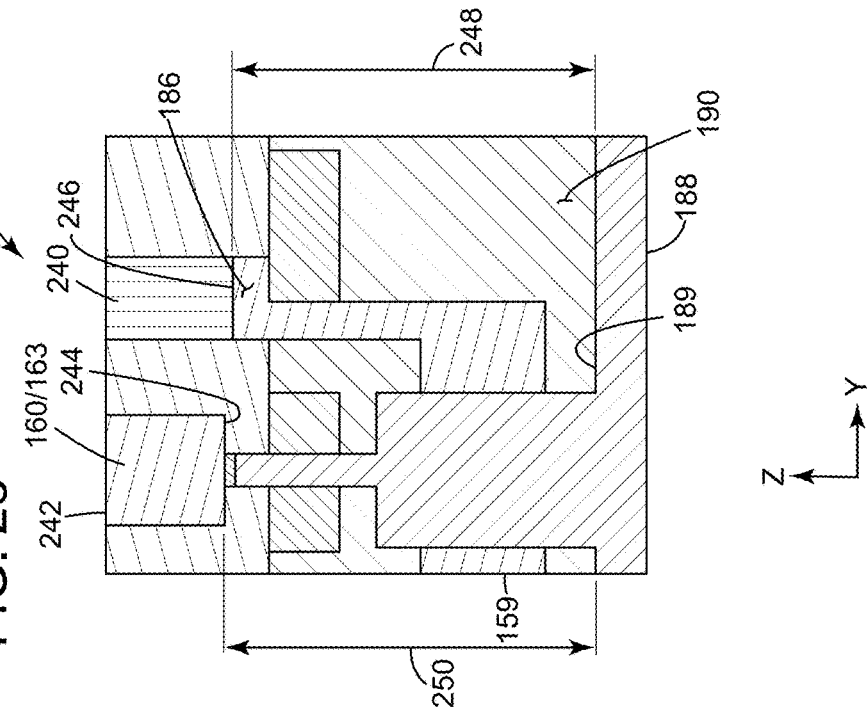
FIG. 28 is a cross-sectional view of the vertical SRAM cell structure of FIG. 27 taken along the line 28-28 in accordance with the present invention.

Referring to FIG. 28, a cross-sectional view of FIG. 27 taken along the line 28-28 of FIG. 27 is presented. It can be seen that the CA contacts 163 have an upper surface 242 and a lower surface 244. The upper surface 242 is disposed at an upper surface height 245 above the substrate 188. The lower surface 244 is disposed at a lower surface height 250 above the substrate 188. It can also be seen that the cross-coupled contacts 184, 186 have an upper surface 246 that is located at an upper surface height 248 above the substrate layer 188. It can also be seen that the upper surface height 248 of the upper surface 246 of the cross-coupled contacts 184 is located below the level of the lower surface height 250 of the lower surface 244 of the CA contacts 163.

By recessing the upper surface height 248 of the cross-coupled contacts 184, 186 below that of the lower surface height 250 of the CA contacts 163, the possibility of the cross-coupled contacts 184, 186 shorting to the CA contacts 163 is greatly reduced. In the particular embodiment illustrated, it is the upper surface height 248 of the $2^{nd}$ cross-coupled contact 186 that is below the level of the lower surface height 250 of the CA contact 163 for the voltage supply 160.

Figure 29:
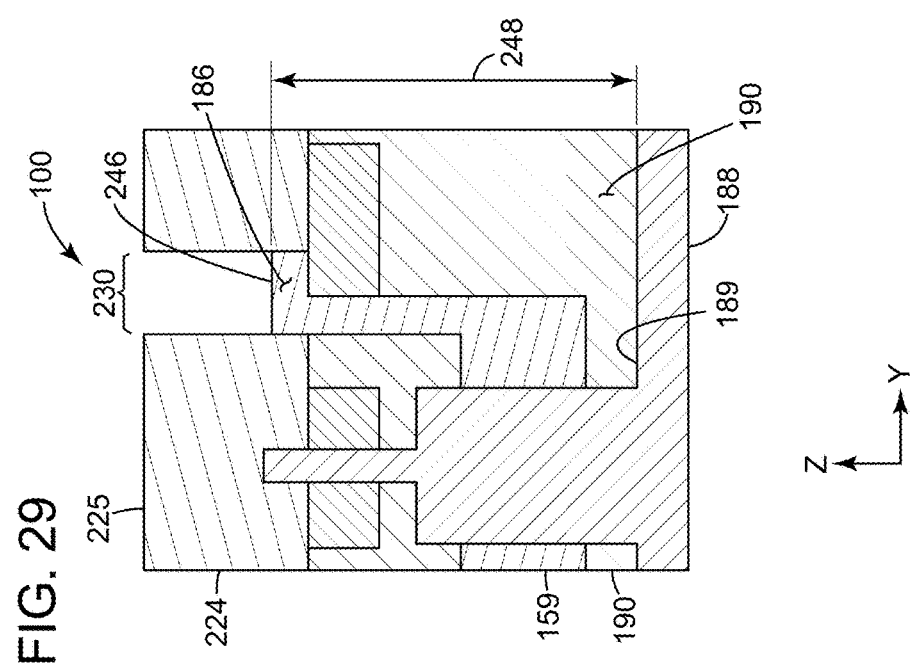
FIG. 29 is a cross-sectional view of an exemplary embodiment of the vertical SRAM cell structure of FIG. 28 at an intermediate stage of manufacture having a cross-coupled contact recessed into the cross-coupled trench in accordance with the present invention.

Referring to FIG. 29, a method of making the recessed cross-coupled contacts 184, 186, which are buried by the dielectric plug 240 (a buried cross-coupled contact) is presented. The method proceeds in substantially the same steps as shown in FIGS. 18-21. However, once the cross-coupled contact 186 has been formed up to the level of the top surface 225 of the dielectric layer 224, the upper surface 246 of the cross-coupled contact 186 is recessed within its cross-coupled trench 230 to the predetermined upper surface height 248 as shown in FIG. 29. The recess may be done by a selective RIE etch process or similar.

Figure 30:
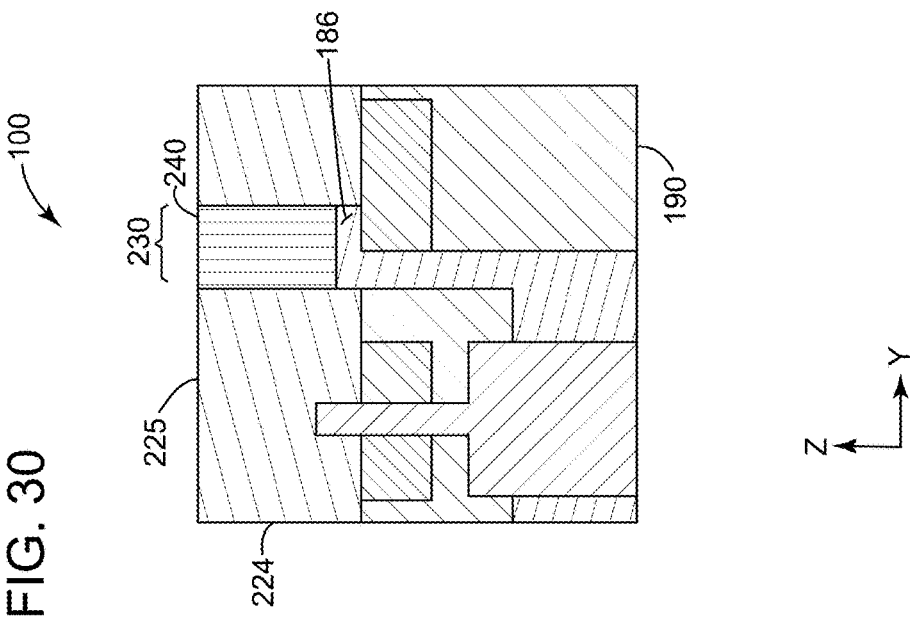
FIG. 30 is a cross-sectional view of an exemplary embodiment of the vertical SRAM cell structure of FIG. 29 having a dielectric plug disposed in the cross-coupled trench over the cross-coupled contact in accordance with the present invention.

Referring to FIG. 30, next the dielectric plug 240 is deposited within the trench 230 and over the cross-coupled contact 186. This can be done by first disposing a low-k dielectric layer over the entire structure 100 and then polishing the low-k dielectric layer down to the top surface 225 of the dielectric layer 224 to form the dielectric plug 240. This can be done utilizing a chemical-mechanical polishing (CMP) process or similar.

The process then follows substantially the same steps illustrated in FIGS. 22-25 to complete the formation of the CA contacts 163.

Referring to FIGS. 31-35, another alternative vertical SRAM cell structure 100 having a buried cross-coupled contact and method of making the same is presented. The buried cross-coupled contact illustrated is the $2^{nd}$ cross-coupled contact 186. However the alternative structure and method applies to the $2^{nd}$ cross-coupled contact 184 as well.

Figure 31:
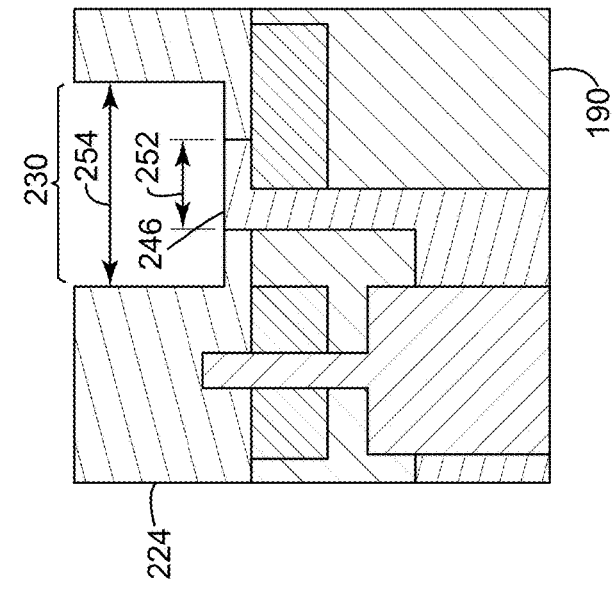
FIG. 31 is a cross-sectional view on an alternative exemplary embodiment of the vertical SRAM cell structure of FIG. 29 at an intermediate stage of manufacture having a cross-coupled contact recessed into the cross-coupled trench and the trench having a $1^{st}$ width in accordance with the present invention.

Referring to FIG. 31, the upper surface 246 of the cross-coupled contact 186 is recess within its cross-coupled trench 230 to the upper surface height 248 in the same manner illustrated in FIG. 29. The exposed upper surface 246 of the cross-coupled contact 186 has a $1^{st}$ width 252.

Referring to FIG. 32, the trench 230 is then widened to a $2^{nd}$ width 254. The $2^{nd}$ width 254 is larger than the $1^{st}$ width 252. The trench 230 may be widened by lithographically patterning and anisotropically etching the trench 230.

Referring to FIG. 33, next the dielectric plug 240 is deposited within the trench 230 and over the cross-coupled contact 186. The plug 240, in this embodiment, is disposed over the top surface 246 of the cross-coupled contact 184 and has a width that is equal to the $2^{nd}$ width 254.

Referring to FIG. 34, the CA contact 163 for the voltage supply 160 is then disposed over the upper S/D region 148 of the $1^{st}$ PU transistor 144. The process of disposing the CA contacts 163 follows substantially the same steps illustrated in FIGS. 22-25.

However, because of the $2^{nd}$ width 254 of the plug 240 is larger than the $1^{st}$ width 252 of the cross-coupled contact 186, the CA contacts 163 can be formed to self-align with sidewalls 256 of the plug 240. This self-alignment virtually prevents contact between the CA contacts 163 and the cross-coupled contacts 184, 186. Therefore, the larger plug width 254 greatly reduces the possibility of an electrical short between the CA contacts 163 and the cross-coupled contacts 184, 186.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A vertical SRAM cell comprising:
a first ($1^{st}$) inverter having a $1^{st}$ pull-up (PU) transistor and a $1^{st}$ pull-down (PD) transistor, the $1^{st}$ PU and $1^{st}$ PD transistors each having a bottom source/drain (S/D) region disposed on a substrate and a channel extending upwards from a top surface of the bottom S/D region;
a second ($2^{nd}$) inverter having a $2^{nd}$ PU transistor and a $2^{nd}$ PD transistor, the $2^{nd}$ PU and $2^{nd}$ PD transistors each having a bottom S/D region disposed on the substrate and a channel extending upwards from a top surface of the bottom S/D region;
a $1^{st}$ metal contact disposed on sidewalls, and not on the top surface, of the bottom S/D regions of the $1^{st}$ PU and $1^{st}$ PD transistors, wherein the $1^{st}$ metal contact physically and electrically connects the bottom S/D region of the $1^{st}$ PU transistor to the bottom S/D region of the $1^{st}$ PD transistor; and
a $2^{nd}$ metal contact disposed on sidewalls, and not on the top surface, of the bottom S/D regions of the $2^{nd}$ PU and $2^{nd}$ PD transistors, wherein the $2^{nd}$ metal contact physically and electrically connects the bottom S/D region of the $2^{nd}$ PU transistor to the bottom S/D region of the $2^{nd}$ PD transistor.

2. The vertical SRAM cell of claim 1 comprising:
a $1^{st}$ common gate structure operatively connected to both channels of the $1^{st}$ PU and $1^{st}$ PD transistors, the $1^{st}$ common gate structure disposed above the bottom S/D regions of the $1^{st}$ PU and the $1^{st}$ PD transistors;
a $2^{nd}$ common gate structure operatively connected to both channels of the $2^{nd}$ PU and $2^{nd}$ PD transistors, the $2^{nd}$ common gate structure disposed above the bottom S/D regions of the $2^{nd}$ PU and $2^{nd}$ PD transistors;
a $1^{st}$ cross-coupled contact disposed on the $1^{st}$ metal contact of the $1^{st}$ inverter and the $2^{nd}$ common gate structure of the $2^{nd}$ inverter, the $1^{st}$ cross-coupled contact not disposed on the bottom S/D regions of the $1^{st}$ PU and $1^{st}$ PD transistors; and
a $2^{nd}$ cross-coupled contact disposed on the $2^{nd}$ metal contact of the $2^{nd}$ inverter and the $1^{st}$ common gate structure of the $1^{st}$ inverter, the $2^{nd}$ cross-coupled contact not disposed on the bottom S/D regions of the $2^{nd}$ PU and $2^{nd}$ PD transistors.

3. The vertical SRAM cell of claim 2 comprising:
each of the $1^{st}$ PU, $1^{st}$ PD, $2^{nd}$ PU and $2^{nd}$ PD transistors having:
an upper S/D region disposed on an upper end of each channel, and
a CA contact disposed on the upper S/D region, the CA contacts each having a lower surface disposed at a lower surface height above the substrate; and
an upper surface of each of the cross-coupled contacts disposed at an upper surface height above the substrate;
wherein the lower surface height of the lower surface of the CA contacts is above a level of the upper surface height of the upper surface of the cross-coupled contacts.

4. The vertical SRAM cell of claim 3 comprising:
each of the upper surfaces of the cross-coupled contacts having a $1^{st}$ width; and
a dielectric plug disposed over each of the upper surfaces of the cross-coupled contacts, each dielectric plug having a $2^{nd}$ width;
wherein the $2^{nd}$ width is larger than the $1^{st}$ width.

5. The vertical SRAM cell of claim 4 comprising:
each dielectric plug having sidewalls; and
each CA contact being self-aligned with at least one sidewall of the dielectric plugs.

6. The vertical SRAM cell of claim 2 comprising:
the $1^{st}$ metal contact, the $1^{st}$ cross-coupled contact, the bottom S/D region of the $1^{st}$ PU transistor, the bottom S/D region of the $1^{st}$ PD transistor and the $2^{nd}$ common gate structure being electrically connected to form a $1^{st}$ storage node; and the $2^{nd}$ metal contact, the $2^{nd}$ cross-coupled contact, the bottom S/D region of the $2^{nd}$ PU transistor, the bottom S/D region of the $2^{nd}$ PD transistor and the $1^{st}$ common gate structure being electrically connected to form a $2^{nd}$ storage node.

7. The vertical SRAM cell of claim 6 comprising:
a $1^{st}$ pass-gate (PG) transistor having a bottom S/D region disposed on the substrate and a channel extending upwards from a top surface of the bottom S/D region;
a $2^{nd}$ PG transistor having a bottom source/drain (S/D) region disposed on the substrate and a channel extending vertically upwards from a top surface of the bottom S/D region;
wherein the bottom S/D region of the $1^{st}$ PG transistor is in electric contact with the $1^{st}$ storage node; and
wherein the bottom S/D region of the $2^{nd}$ PG transistor is in electric contact with the $2^{nd}$ storage node.

8. The vertical SRAM cell of claim 7 comprising:
the bottom S/D regions of the $1^{st}$ PG and $1^{st}$ PD transistors being a single $1^{st}$ common bottom S/D region; and
the bottom S/D region of the $2^{nd}$ PG and $2^{nd}$ PD transistors being a single $2^{nd}$ common bottom S/D region.

9. The vertical SRAM cell of claim 7 comprising the channels of the $1^{st}$ PU, $1^{st}$ PD, $1^{st}$ PG, $2^{nd}$ PU, $2^{nd}$ PD and $2^{nd}$ PG transistors being one of a fin and a nanowire.

10. The vertical SRAM cell of claim 7 comprising:
the $1^{st}$ PU and $2^{nd}$ PU transistors being a p-type transistor;
the $1^{st}$ PD and $2^{nd}$ PD transistors being an n-type transistor; and
the $1^{st}$ PG and $2^{nd}$ PG transistors being an n-type transistor.

11. The vertical SRAM cell of claim 1 comprising:
the $1^{st}$ metal contact disposed on a single sidewall of the bottom S/D region of the $1^{st}$ PU transistor and an adjacent single sidewall of the bottom S/D region of the $1^{st}$ PD transistor; and
the $2^{nd}$ metal contact disposed on a single sidewall of the bottom S/D region of the $2^{nd}$ PU transistor and an adjacent single sidewall of the bottom S/D region of the $2^{nd}$ PD transistor.

12. The vertical SRAM cell of claim 7 comprising:
the $1^{st}$ metal contact disposed on all sidewalls, and on no top surfaces, of the $1^{st}$ PU, $1^{st}$ PD and $1^{st}$ PG transistors; and
the $2^{nd}$ metal contact disposed on all sidewalls, and on no top surfaces, of the $2^{nd}$ PU, $2^{nd}$ PD and $2^{nd}$ PG transistors.

13. The vertical SRAM cell of claim 2 comprising:
the $1^{st}$ metal contact including an extension having an extension area;
the $1^{st}$ cross-coupled contact landing on the extension of the $1^{st}$ metal contact, the $1^{st}$ cross-coupled contact having an area footprint where the $1^{st}$ cross-coupled contact lands on the extension of the $1^{st}$ metal contact;
the $2^{nd}$ metal contact including an extension having an extension area;
the $2^{nd}$ cross-coupled contact landing on the extension of the $2^{nd}$ metal contact, the $2^{nd}$ cross-coupled contact having an area footprint where the $2^{nd}$ cross-coupled contact lands on the extension of the $2^{nd}$ metal contact;
wherein the extension area of the $1^{st}$ metal contact is larger than the area footprint of the $1^{st}$ cross-coupled contact; and
wherein the extension area of the $2^{nd}$ metal contact is larger than the area footprint of the $2^{nd}$ cross-coupled contact.

14. A vertical SRAM cell comprising:
a first ($1^{st}$) inverter having a $1^{st}$ pull-up (PU) transistor and a $1^{st}$ pull-down (PD) transistor, the $1^{st}$ PU and $1^{st}$ PD transistors each having a bottom source/drain (S/D) region disposed on a substrate and a channel extending upwards from a top surface of the bottom S/D region;
a second ($2^{nd}$) inverter having a $2^{nd}$ PU transistor and a $2^{nd}$ PD transistor, the $2^{nd}$ PU and $2^{nd}$ PD transistors each having a bottom S/D region disposed on the substrate and a channel extending upwards from a top surface of the bottom S/D region;
a $1^{st}$ metal contact disposed on sidewalls, and not on the top surface, of the bottom S/D regions of the $1^{st}$ PU and $1^{st}$ PD transistors;
a $2^{nd}$ metal contact disposed on sidewalls, and not on the top surface, of the bottom S/D regions of the $2^{nd}$ PU and $2^{nd}$ PD transistors;
a $1^{st}$ common gate structure operatively connected to both channels of the $1^{st}$ PU and $1^{st}$ PD transistors, the $1^{st}$ common gate structure disposed above the bottom S/D regions of the $1^{st}$ PU and the $1^{st}$ PD transistors;
a $2^{nd}$ common gate structure operatively connected to both channels of the $2^{nd}$ PU and $2^{nd}$ PD transistors, the $2^{nd}$ common gate structure disposed above the bottom S/D regions of the $2^{nd}$ PU and $2^{nd}$ PD transistors;
a $1^{st}$ cross-coupled contact disposed on the $1^{st}$ metal contact of the $1^{st}$ inverter and the $2^{nd}$ common gate structure of the $2^{nd}$ inverter, the $1^{st}$ cross-coupled contact not disposed on the bottom S/D regions of the $1^{st}$ PU and $1^{st}$ PD transistors;
a $2^{nd}$ cross-coupled contact disposed on the $2^{nd}$ metal contact of the $2^{nd}$ inverter and the $1^{st}$ common gate structure of the $1^{st}$ inverter, the $2^{nd}$ cross-coupled contact not disposed on the bottom S/D regions of the $2^{nd}$ PU and $2^{nd}$ PD transistors;
wherein, each of the $1^{st}$ PU, $1^{st}$ PD, $2^{nd}$ PU and $2^{nd}$ PD transistors have:
an upper S/D region disposed on an upper end of each channel, and
a CA contact disposed on the upper S/D region, the CA contacts each having a lower surface disposed at a lower surface height above the substrate; and
wherein, an upper surface of each of the cross-coupled contacts disposed at an upper surface height above the substrate; and
wherein the lower surface height of the lower surface of the CA contacts is above a level of the upper surface height of the upper surface of the cross-coupled contacts.

15. A vertical SRAM cell comprising:
a first ($1^{st}$) inverter having a $1^{st}$ pull-up (PU) transistor and a $1^{st}$ pull-down (PD) transistor, the $1^{st}$ PU and $1^{st}$ PD transistors each having a bottom source/drain (S/D) region disposed on a substrate and a channel extending upwards from a top surface of the bottom S/D region;
a second ($2^{nd}$) inverter having a $2^{nd}$ PU transistor and a $2^{nd}$ PD transistor, the $2^{nd}$ PU and $2^{nd}$ PD transistors each having a bottom S/D region disposed on the substrate and a channel extending upwards from a top surface of the bottom S/D region;
a $1^{st}$ metal contact disposed on sidewalls, and not on the top surface, of the bottom S/D regions of the $1^{st}$ PU and $1^{st}$ PD transistors;
a $2^{nd}$ metal contact disposed on sidewalls, and not on the top surface, of the bottom S/D regions of the $2^{nd}$ PU and $2^{nd}$ PD transistors;

the 1$^{st}$ metal contact disposed on a single sidewall of the bottom S/D region of the 1$^{st}$ PU transistor and an adjacent single sidewall of the bottom S/D region of the 1$^{st}$ PD transistor; and the 2$^{nd}$ metal contact disposed on a single sidewall of the bottom S/D region of the 2$^{nd}$ PU transistor and an adjacent single sidewall of the bottom S/D region of the 2$^{nd}$ PD transistor.

\* \* \* \* \*